(12) United States Patent
Tabata et al.

(10) Patent No.: US 7,244,977 B2
(45) Date of Patent: Jul. 17, 2007

(54) LONGITUDINAL MISFET MANUFACTURING METHOD, LONGITUDINAL MISFET, SEMICONDUCTOR STORAGE DEVICE MANUFACTURING METHOD, AND SEMICONDUCTOR STORAGE DEVICE

(75) Inventors: Tsuyoshi Tabata, Futaba (JP); Kazuo Nakazato, Nagoya (JP); Hiroshi Kujirai, Kunitachi (JP); Masahiro Moniwa, Sayama (JP); Hideyuki Matsuoka, Nishitokyo (JP); Teruaki Kisu, deceased, late of Tokyo (JP); by Teruo Kisu, legal representative, Tokyo (JP); by Haruko Kisu, legal representative, Tokyo (JP); Satoru Haga, Akishima (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/493,443

(22) PCT Filed: Oct. 10, 2002

(86) PCT No.: PCT/JP02/10510

§ 371 (c)(1),
(2), (4) Date: Aug. 11, 2005

(87) PCT Pub. No.: WO03/036714

PCT Pub. Date: May 1, 2003

(65) Prior Publication Data

US 2006/0035434 A1 Feb. 16, 2006

(30) Foreign Application Priority Data

Oct. 24, 2001 (JP) ............................. 2001-326756

(51) Int. Cl.
*H01L 29/768* (2006.01)

(52) U.S. Cl. ...................... 257/220; 257/278; 257/331; 257/334; 257/368; 257/377; 257/664; 257/773; 257/903; 257/E21.661; 257/E21.703; 257/E21.099; 257/E27.099; 257/E27.112; 257/E29.274

(58) Field of Classification Search ................. 257/220, 257/278, 330, 331, 334, 368, 377, 664, 773, 257/903, E21.661, E21.703, E27.099, E27.112, 257/E29.274

See application file for complete search history.

(56) References Cited

U.S. PATENT DOCUMENTS 4,974,060 A * 11/1990 Ogasawara .................. 257/296

(Continued)

FOREIGN PATENT DOCUMENTS

JP 5-110019 A 4/1993

(Continued)

*Primary Examiner*—Michelle Estrada
*Assistant Examiner*—Jarrett J. Stark
(74) *Attorney, Agent, or Firm*—Antonelli, Terry, Stout & Kraus, LLP.

(57) ABSTRACT

A semiconductor memory device includes a vertical MISFET having a source region, a channel forming region, a drain region, and a gate electrode formed on a sidewall of the channel forming region via a gate insulating film. In manufacturing the semiconductor memory device, the vertical MISFET in which leakage current (off current) is less can be realized by: counter-doping boron of a conductivity type opposite to that of phosphorus diffused into a poly-crystalline silicon film (10) constituting the channel forming region from an n type poly-crystalline silicon film (7) constituting the source region of the vertical MISFET, and the above-mentioned poly-crystalline silicon film (10); and reducing an effective impurity concentration in the poly-crystalline silicon film (10).

2 Claims, 36 Drawing Sheets

U.S. PATENT DOCUMENTS

| | | | |
|---|---|---|---|
| 5,270,224 A | * | 12/1993 | Furumura et al. .......... 438/320 |
| 5,670,803 A | * | 9/1997 | Beilstein et al. ............ 257/278 |
| 5,828,094 A | | 10/1998 | Lee |
| 6,066,869 A | | 5/2000 | Noble et al. |
| 6,093,614 A | * | 7/2000 | Gruening et al. ........... 438/388 |
| 6,096,596 A | | 8/2000 | Gonzalez |
| 6,114,725 A | | 9/2000 | Furukawa et al. |
| 6,150,210 A | | 11/2000 | Arnold |
| 6,150,687 A | | 11/2000 | Noble et al. |
| 6,211,531 B1 | | 4/2001 | Nakazato et al. |

FOREIGN PATENT DOCUMENTS

| | | |
|---|---|---|
| JP | 11-87541 | 3/1999 |

* cited by examiner

DEPENDENCY OF CHANNEL IMPURITY CONCENTRATION
ON SUB-THRESHOLD CHARACTERISTICS

LONGITUDINAL MISFET MANUFACTURING METHOD, LONGITUDINAL MISFET, SEMICONDUCTOR STORAGE DEVICE MANUFACTURING METHOD, AND SEMICONDUCTOR STORAGE DEVICE

TECHNICAL FIELD OF THE INVENTION

The present invention relates to a vertical MISFET, a semiconductor memory device, and their manufacturing methods and, particularly, to a technique effectively applied to a semiconductor memory device in which a transistor composed of a memory cell is constituted by a vertical MISFET (Metal Insulator Semiconductor Field Effect transistor).

BACKGROUND OF THE INVENTION

The DRAM (Dynamic Random Access Memory) has been mainly used as a general-purpose and high-capacity semiconductor memory device. Memory cells in the DRAM are placed at the intersections between a plurality of word lines and a plurality of bit lines arranged in matrix on a main surface of a semiconductor substrate, and each is composed of one memory cell selecting MISFET and one capacitive element (capacitor) connected to this MISFET in series. The memory cell selecting MISFET is mainly composed of a gate oxide film, a gate electrode formed integrally with a word line, and a pair of semiconductor regions constituting a source and a drain. The bit line is arranged on the memory cell selecting MISFET and electrically connected to one of the source and drain. Similarly, a data storage capacitor is arranged on the memory cell selecting MISFET and electrically connected to the other of the source and drain.

Japanese Patent Laid-Open No. 5-110019 discloses a one-transistor and one-capacitor semiconductor memory device in which a trench capacitor is formed in a semiconductor substrate and a vertical MIS transistor is arranged thereon.

Japanese Patent Laid-Open No. 11-87541 discloses another vertical MISFET, which is different from that shown in Japanese Patent Laid-Open No. 5-110019. In this vertical MISFET, a columnar laminated structure made of poly-crystalline silicon is provided on a semiconductor substrate, and a lower semiconductor layer (source region), an intermediate semiconductor layer (channel forming region), and an upper semiconductor layer (drain region) are formed in this order from below in the laminated structure. A sidewall of the intermediate semiconductor layer functions as a channel region and a gate insulating film is formed on the surface of the sidewall. Also, a gate electrode is formed on the sidewall of the laminated structure via the above-mentioned gate insulating film.

DISCLOSURE OF THE INVENTION

The inventors of the present invention have been developing a semiconductor memory device using the vertical MISFET disclosed in Japanese Patent Laid-Open No. 11-87541. In this vertical MISFET, the source region, the channel forming region, and the drain region are formed in the columnar laminated structure formed on the semiconductor substrate. Therefore, there is an advantage of being capable of reducing an area occupied by the transistor. For example, if the trench capacitor is formed inside the trench formed in the semiconductor substrate and the memory cell selecting MISFET is formed thereon by using this vertical MISFET, it is possible to realize the memory cell with a smaller cell size than that of a conventional DRAM.

Meanwhile, since the source and drain regions of the vertical MISFET are formed by laminating poly-crystalline silicon films each having a high impurity concentration on and below the channel forming region composed of an undoped poly-crystalline silicon film or a poly-crystalline silicon film having a extremely low impurity concentration, the impurities in the source and drain are thermally diffused easily into the channel forming region by a thermal treatment during a process thereof.

However, since the leakage current (off current) during the time when the vertical MISFET is not operated is reduced by complete depletion of the channel forming region, there is the problem that if the impurities in the source and drain regions are thermally diffused in the channel forming region, the complete depletion of the channel forming region is hindered and the leakage current (off current) is increased. Additionally, the threshold voltage is varied due to the diffusion of the impurities into the channel forming region.

An object of the present invention is to provide a technique capable of achieving the vertical MISFET in which the leakage current (off current) is smaller.

An object of the present invention is to provide a technique capable of achieving the vertical MISFET in which the variation of the threshold voltage is reduced.

The above and other objects and novel characteristics of the present invention will be apparent from the description of the specification and the accompanying drawings.

Outlines of the typical ones of the inventions disclosed in this application will be briefly described as follows.

The present invention is a manufacturing method for a MISFET having a source region, a channel forming region, and a drain region formed over a main surface of a semiconductor substrate, and a gate electrode formed on a sidewall of said channel forming region via a gate insulating film, or is a manufacturing method for a semiconductor memory device provided with said MISFET, the method comprising the steps of: forming the source region containing a first impurity over the main surface of the semiconductor substrate; forming the channel forming region over said source region; introducing a second impurity of a conductivity type opposite to that of said first impurity into said channel forming region; and forming, over said channel forming region, the drain region containing said first impurity.

Also, the semiconductor memory device according to the present invention is provided with a MISFET having a source region, a channel forming region, and a drain region formed over a main surface of a semiconductor substrate, and a gate electrode formed on a sidewall of said channel forming region via a gate insulating film, wherein said source and drain regions are each composed of a poly-crystalline silicon film containing a first impurity, and said channel forming region is composed of a poly-crystalline silicon film containing a second impurity of a conductivity type opposite to that of said first impurity.

BEST MODE FOR CARRYING OUT THE INVENTION

Hereinafter, embodiments of the present invention will be described in detail with reference to the accompanying drawings. Note that components having the same function are denoted by the same reference symbol throughout the drawings for describing the embodiments and the repetitive description thereof will be omitted. Additionally, the description of the same or similar portion will not be repeated in principle except the case where the description is particularly required.

(First Embodiment)

In this embodiment, the present invention is applied to a DRAM constituting a memory cell that is composed of one memory cell selecting MISFET and one capacitor, and a manufacturing method thereof will be described in order of process step with reference to FIGS. 1 to 24.

Figure 1:
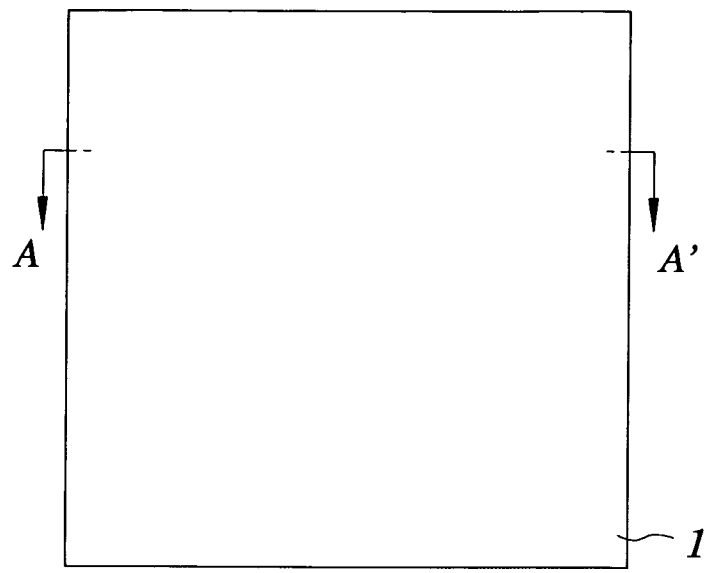
FIG. 1 is a plan view showing a principal part of a semiconductor substrate in a semiconductor memory device manufacturing method according to an embodiment of the present invention.
Figure 2:
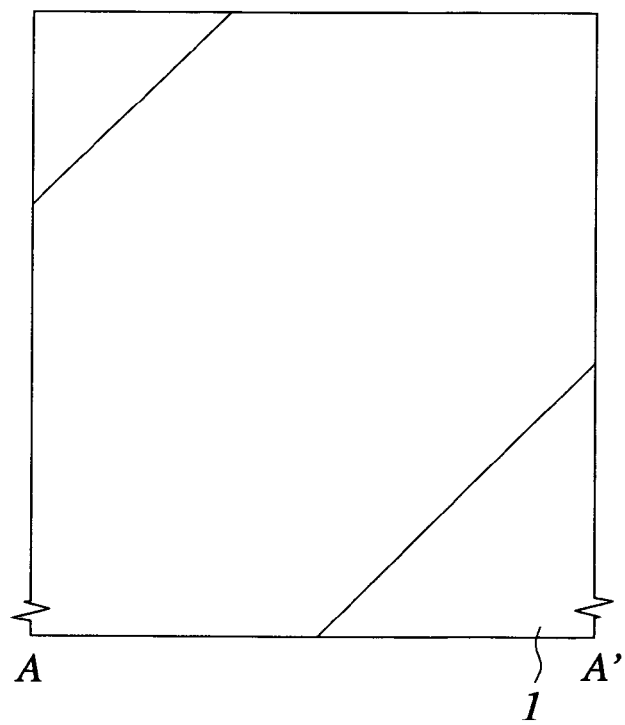
FIG. 2 is a sectional view showing a principal part of the semiconductor substrate taken along the line A–A' in FIG. 1.

FIG. 1 is a plan view of a semiconductor substrate (hereinafter, simply referred to as "substrate") 1 showing an area equivalent to approximately four memory cells, and FIG. 2 is a sectional view of the substrate 1 taken along the line A–A' in FIG. 1. Note that the substrate 1 is made of p type mono-crystalline silicon although not particularly limited.

Figure 3:
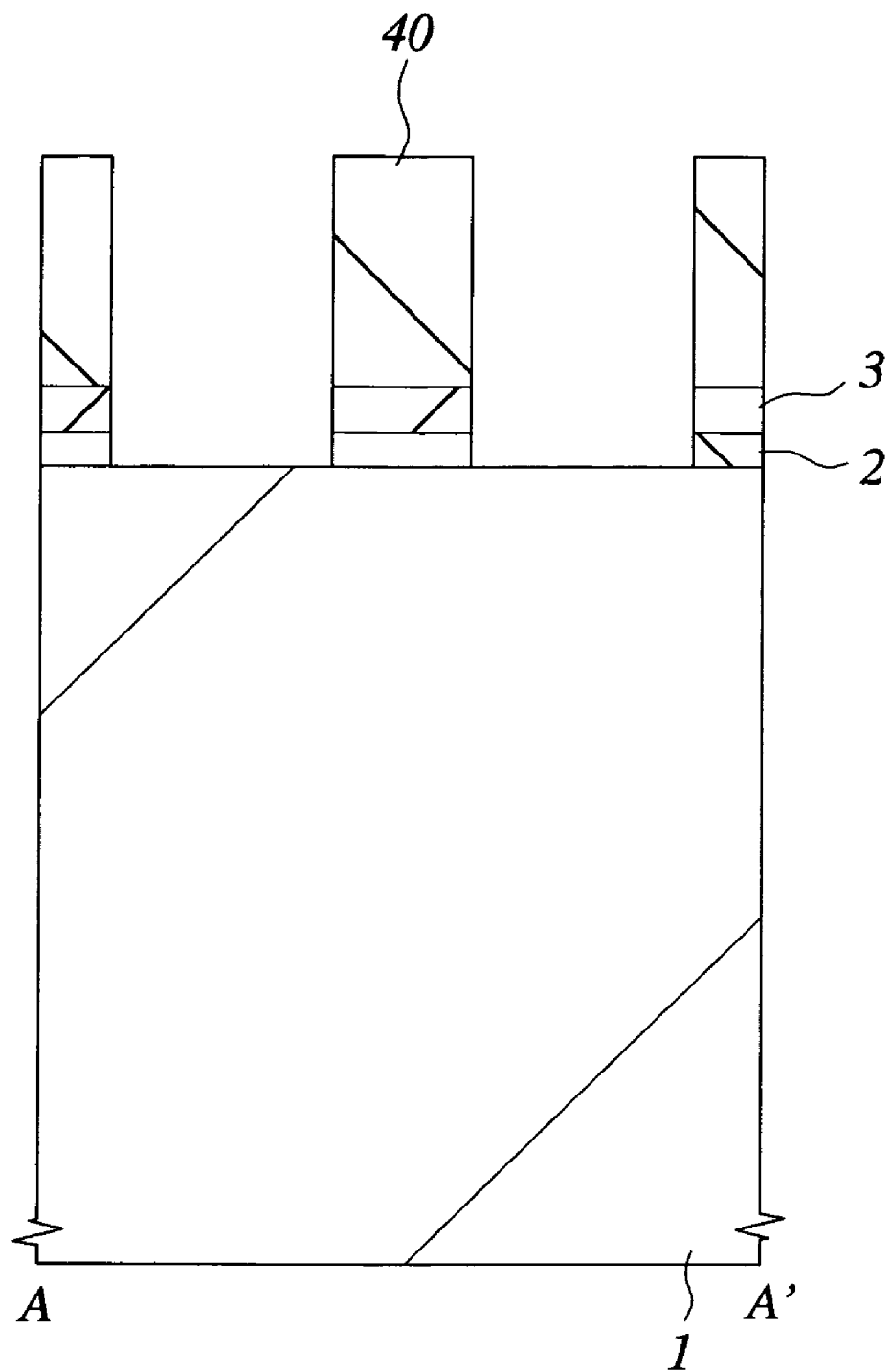
FIG. 3 is a sectional view showing a principal part of a semiconductor substrate in the semiconductor memory device manufacturing method according to the embodiment of the present invention.

The memory cell is formed in the manner as follows. First, as shown in FIG. 3, a silicon oxide film 2 with a thickness of approximately 50 to 100 nm and a silicon nitride film 3 with a thickness of approximately 140 nm are deposited on the substrate 1 by a CVD method. Thereafter, the silicon nitride film 3 and the silicon oxide film 2 in a memory cell forming region are removed by dry etching with using a photoresist film 40 as a mask.

Figure 4:
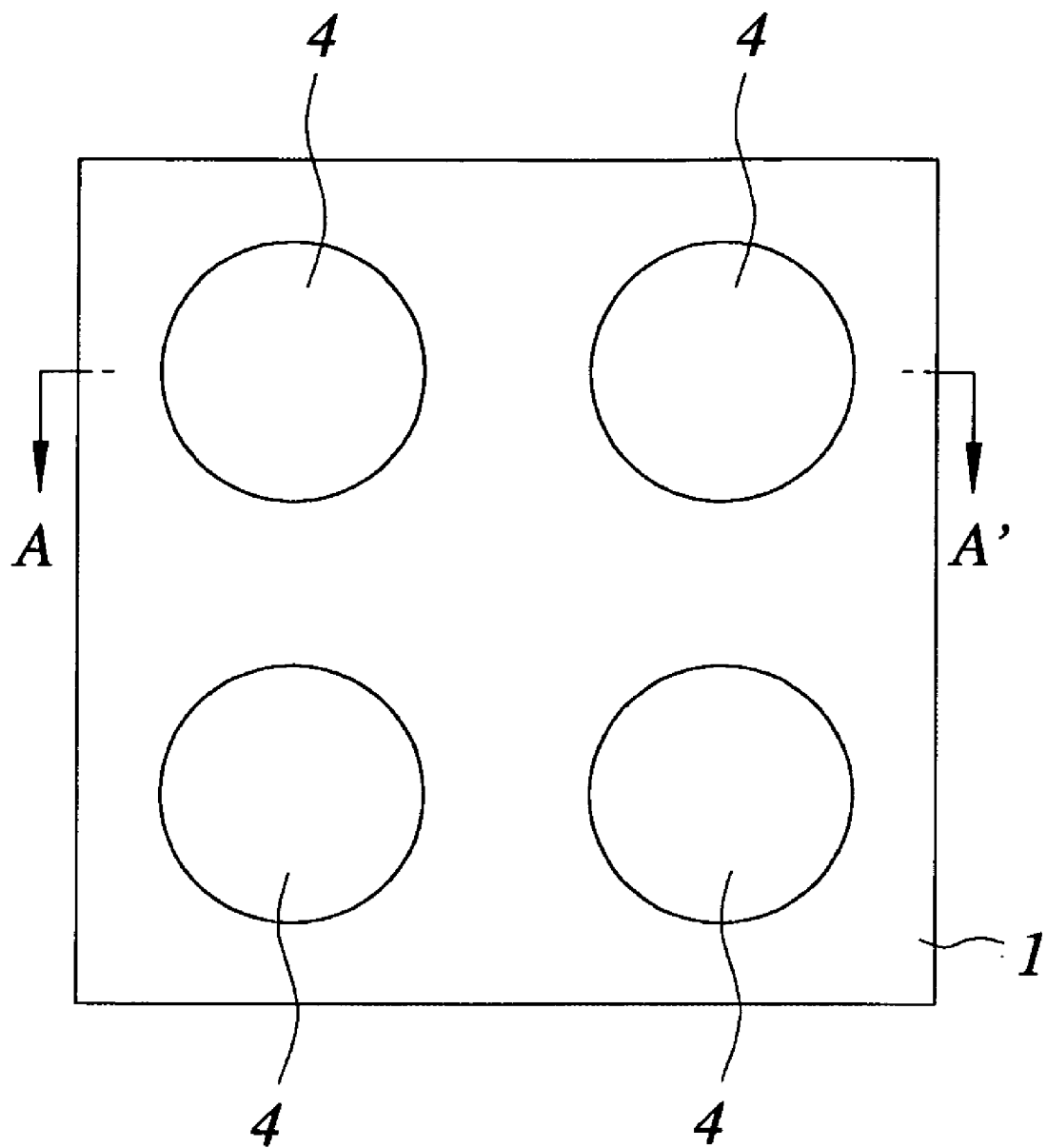
FIG. 4 is a plan view showing a principal part of a semiconductor substrate in the semiconductor memory device manufacturing method according to the embodiment of the present invention.
Figure 5:
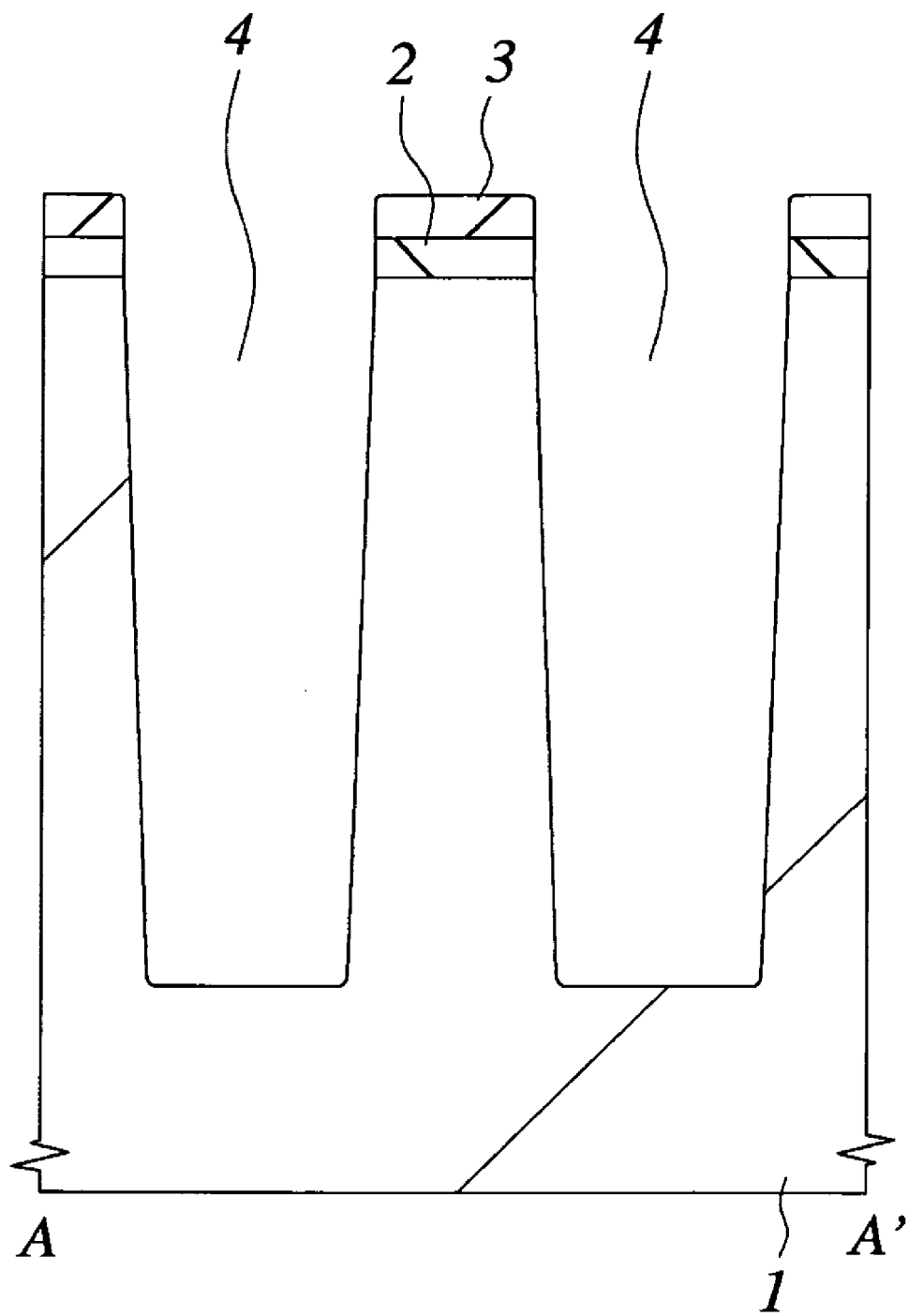
FIG. 5 is a sectional view showing a principal part of a semiconductor substrate in the semiconductor memory device manufacturing method according to the embodiment of the present invention.

Next, after removing the photoresist film 40 by ashing, trenches 4 each having a diameter of 120 nm and a depth of approximately 1 μm are formed in the memory cell forming region of the substrate 1 by the dry etching with using the silicon nitride film 3 as a mask, as shown in FIGS. 4 and 5.

Figure 6:
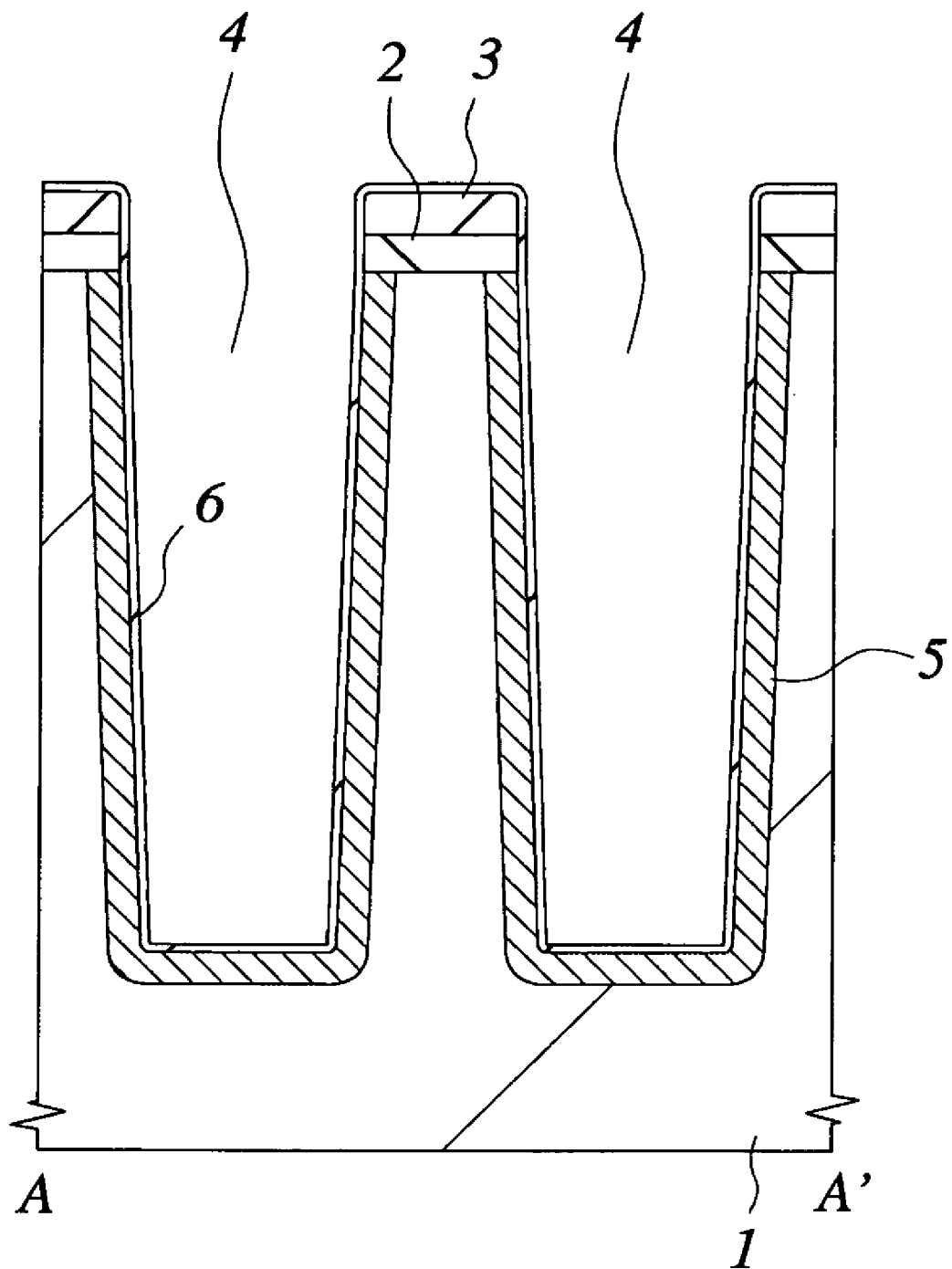
FIG. 6 is a sectional view showing a principal part of a semiconductor substrate in the semiconductor memory device manufacturing method according to the embodiment of the present invention.

Next, as shown in FIG. 6, an n type semiconductor region 5 is formed on the inner surface of the trench 4 by vapor diffusion of an n type impurity such as phosphorus (P) or arsenic (As) in a high-temperature atmosphere of approximately 1000° C. Thereafter, a silicon nitride film 6 with a thickness of approximately 7 nm is deposited on the substrate 1 by the CVD method, and then the silicon nitride film 6 is oxynitrided with using a $N_2O$ gas. The n type semiconductor region 5 constitutes a plate electrode of the capacitor and the oxynitrided silicon nitride film 6 constitutes a capacitor insulating film of the capacitor. The capacitor insulating film can also be formed of a high-dielectric film such as a tantalum oxide film instead of the silicon nitride film 6.

Figure 7:
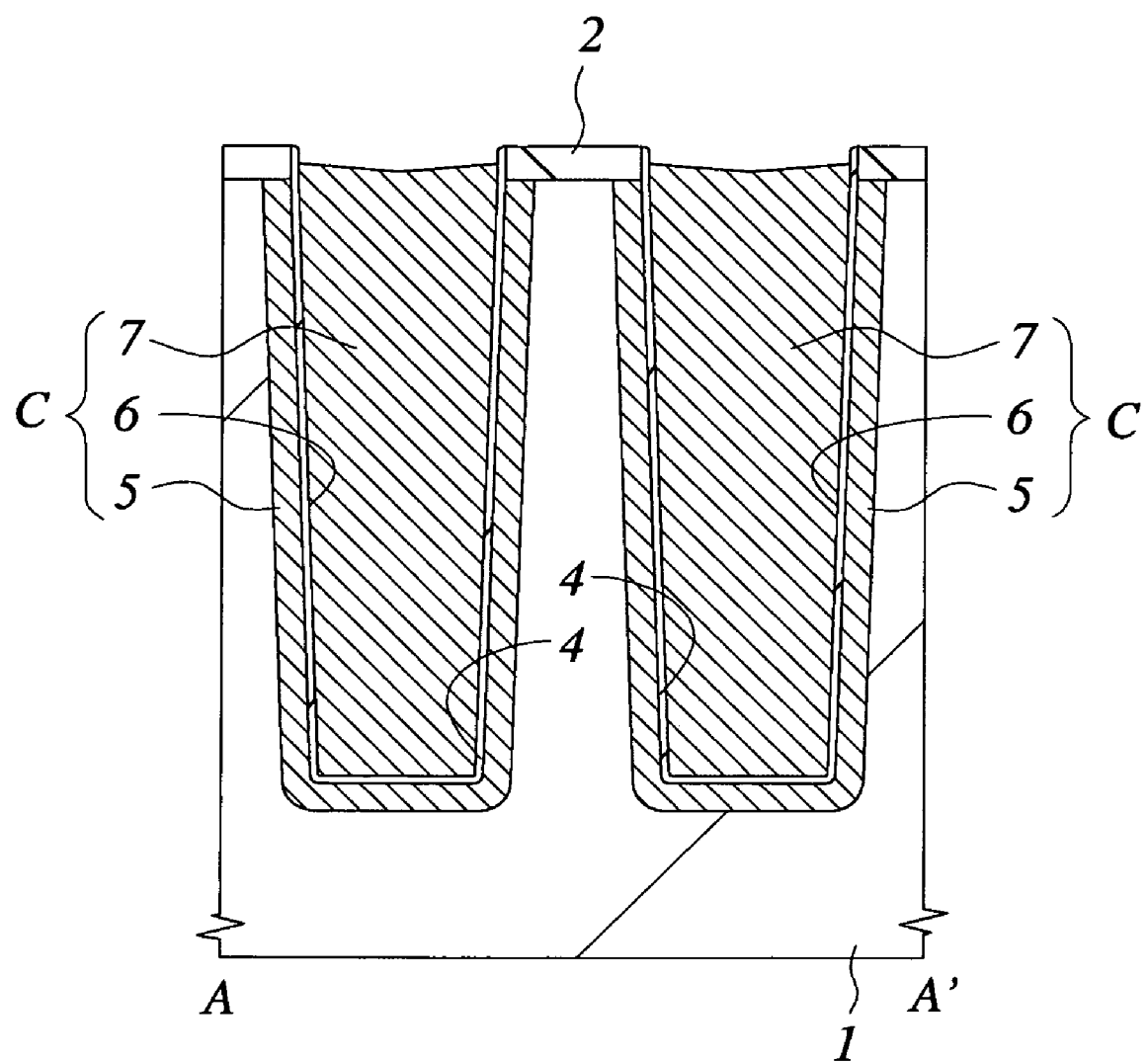
FIG. 7 is a sectional view showing a principal part of a semiconductor substrate in the semiconductor memory device manufacturing method device according to the embodiment of the present invention.

Next, as shown in FIG. 7, after depositing, on the substrate 1, an n type poly-crystalline silicon film 7 doped with phosphorus of approximately $10^{20}/cm^3$, the poly-crystalline silicon film 7, the silicon nitride film 6, and the silicon nitride film 3 outside the trenches 4 are removed by the dry etching. This poly-crystalline silicon film 7 is deposited up to the thickness (70 nm or more) sufficient to completely fill each interior of the trenches 4.

The poly-crystalline silicon film 7 left in the trench 4 constitutes a storage electrode of the capacitor and also constitutes a source region of the memory cell selecting MISFET formed at the upper portion of the trench 4 in the subsequent step. Note that although the source region (poly-crystalline silicon film 7) can function as the drain region of the memory cell selecting MISFET, it is treated as the source region as a matter of convenience.

Through the process described above, the capacitor C having the n type semiconductor region 5 serving as a plate electrode, the silicon nitride film 6 serving as a capacitor insulating film, and the poly-crystalline silicon film 7 serving as a storage electrode is formed in the trench 4.

Figure 8:
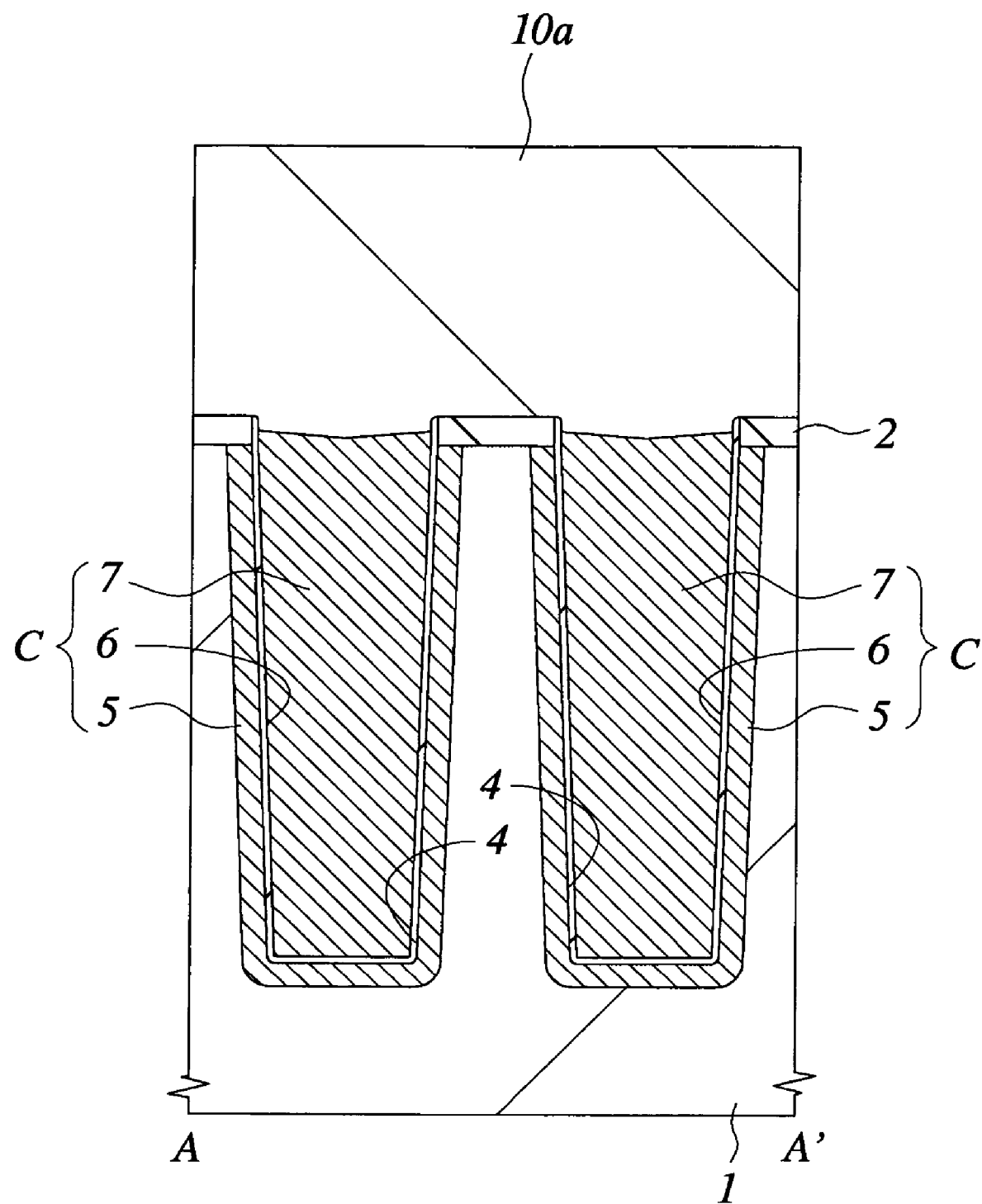
FIG. 8 is a sectional view showing a principal part of a semiconductor substrate in the semiconductor memory device manufacturing method according to the embodiment of the present invention.

Next, as shown in FIG. 8, an amorphous silicon film (intermediate semiconductor layer) 10a with a thickness of approximately 400 nm is deposited on the substrate 1 by the CVD method. This amorphous silicon film 10a is made of amorphous silicon having an impurity concentration of $1 \times 10^{16}/cm^3$ or less or undoped amorphous silicon containing substantially no impurity.

Figure 9:
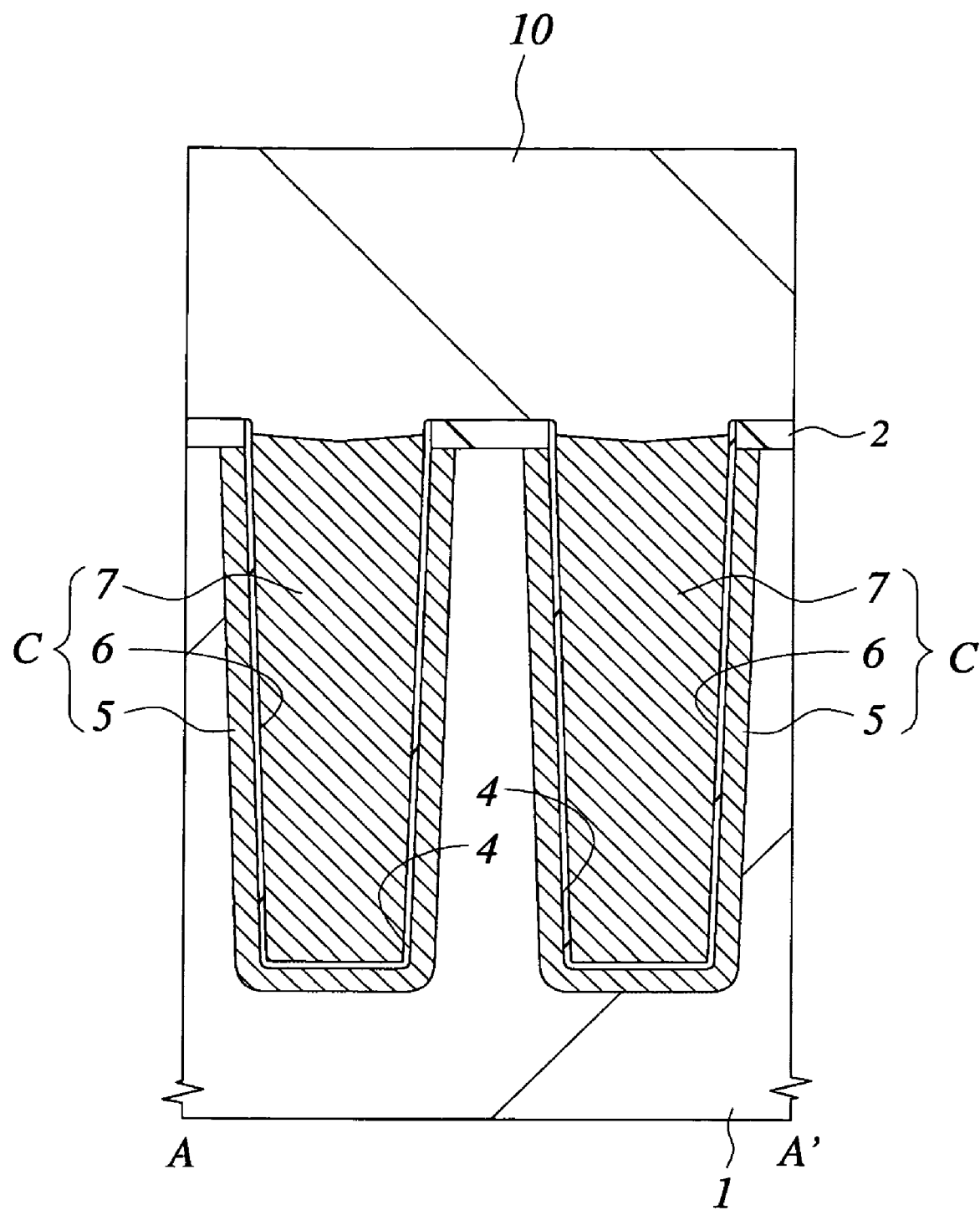
FIG. 9 is a sectional view showing a principal part of a semiconductor substrate in the semiconductor memory device manufacturing method according to the embodiment of the present invention.

Next, a thermal treatment to the substrate 1 is performed to convert the above-mentioned amorphous silicon film 10a to a poly-crystalline silicon film 10 (FIG. 9). This thermal treatment is performed at a temperature of at least 550° C. or higher, preferably at a temperature of approximately 600° C. to 800° C.

The above-mentioned poly-crystalline silicon film 10a may be formed of a poly-crystalline silicon film deposited by the CVD method. However, the film, obtained by performing the thermal treatment to and poly-crystallizing the amorphous silicon film 10a, becomes one better in film quality and fewer in crystal defect. Since the poly-crystalline silicon film 10 is used as the channel forming region of the memory cell selecting MISFET, it is desirable that the poly-crystalline silicon film 10 is formed by the methods capable of reducing as much crystal defects as possible.

When the above-mentioned thermal treatment is performed, a part of phosphorus contained in the n type poly-crystalline silicon film 7 (storage electrode and source region) formed below the poly-crystalline silicon film 10 is thermally diffused into the poly-crystalline silicon film 10 and the impurity concentration of the poly-crystalline silicon film 10 is increased. Therefore, it becomes difficult to achieve the complete depletion of the channel forming region formed of the poly-crystalline silicon film 10. Since the threshold voltage of the memory cell selecting MISFET is varied by phosphorus diffused into the channel forming region, there also arises the problem that the operation of the memory cell becomes unstable.

Figure 10:
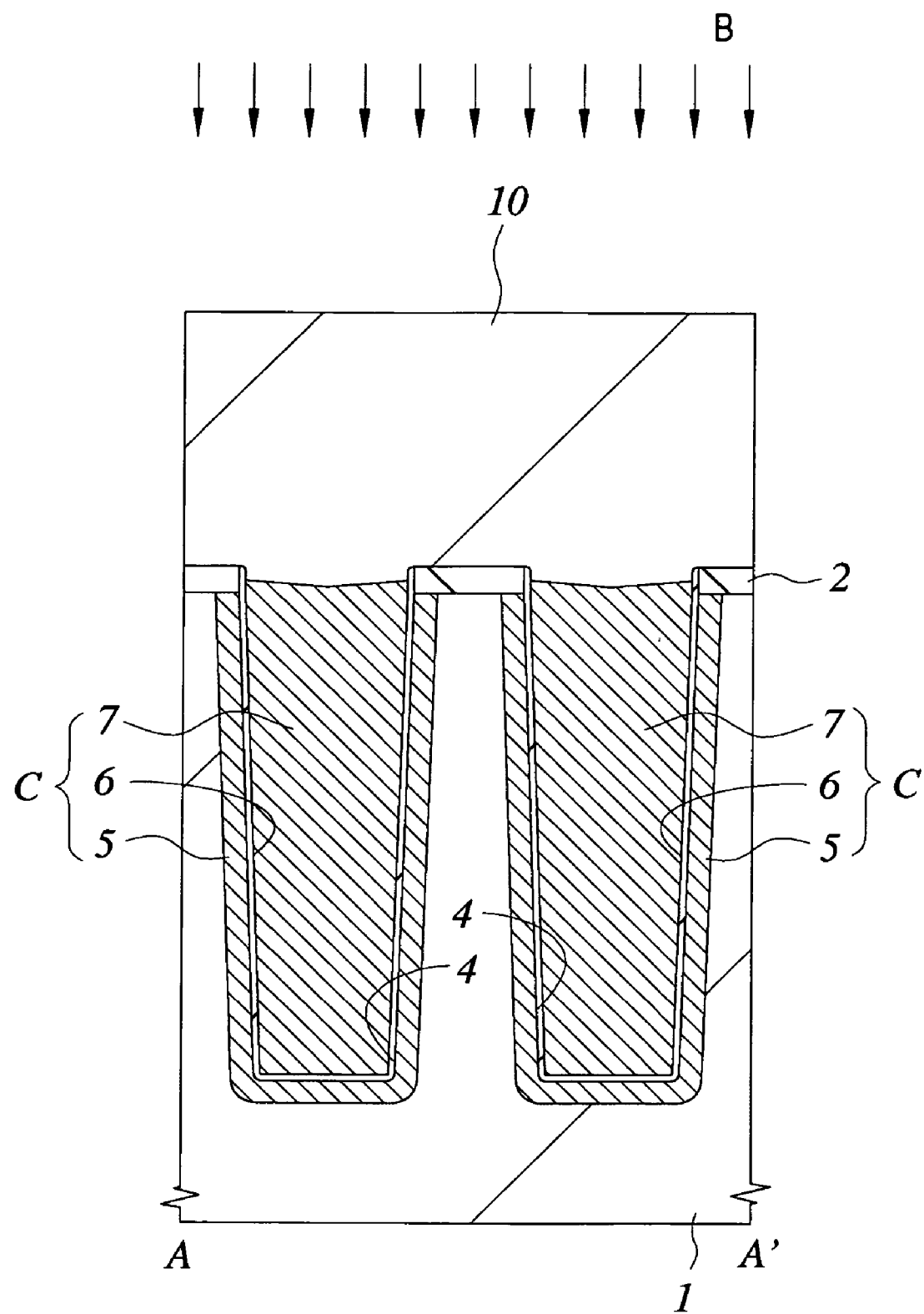
FIG. 10 is a sectional view showing a principal part of a semiconductor substrate in the semiconductor memory device manufacturing method according to the embodiment of the present invention.

Consequently, boron (or $BF_2$), which is of opposite conductivity type to that of phosphorus, is introduced into the poly-crystalline silicon film 10, as shown in FIG. 10. In this introduction of boron (or $BF_2$), an ion implantation method in which boron (or $BF_2$) is vertically implanted into the main surface of the substrate 1 is used, and energy of the implantation is controlled so that a boron concentration around the central portion of the poly-crystalline silicon film 10 can be higher than those above and below the central portion. Also, a dose amount of boron (or $BF_2$) is controlled so that a concentration of boron introduced into the poly-crystalline silicon film 10 can be equal to or slightly higher than that of phosphorus diffused into the poly-crystalline silicon film 10.

Figure 11:
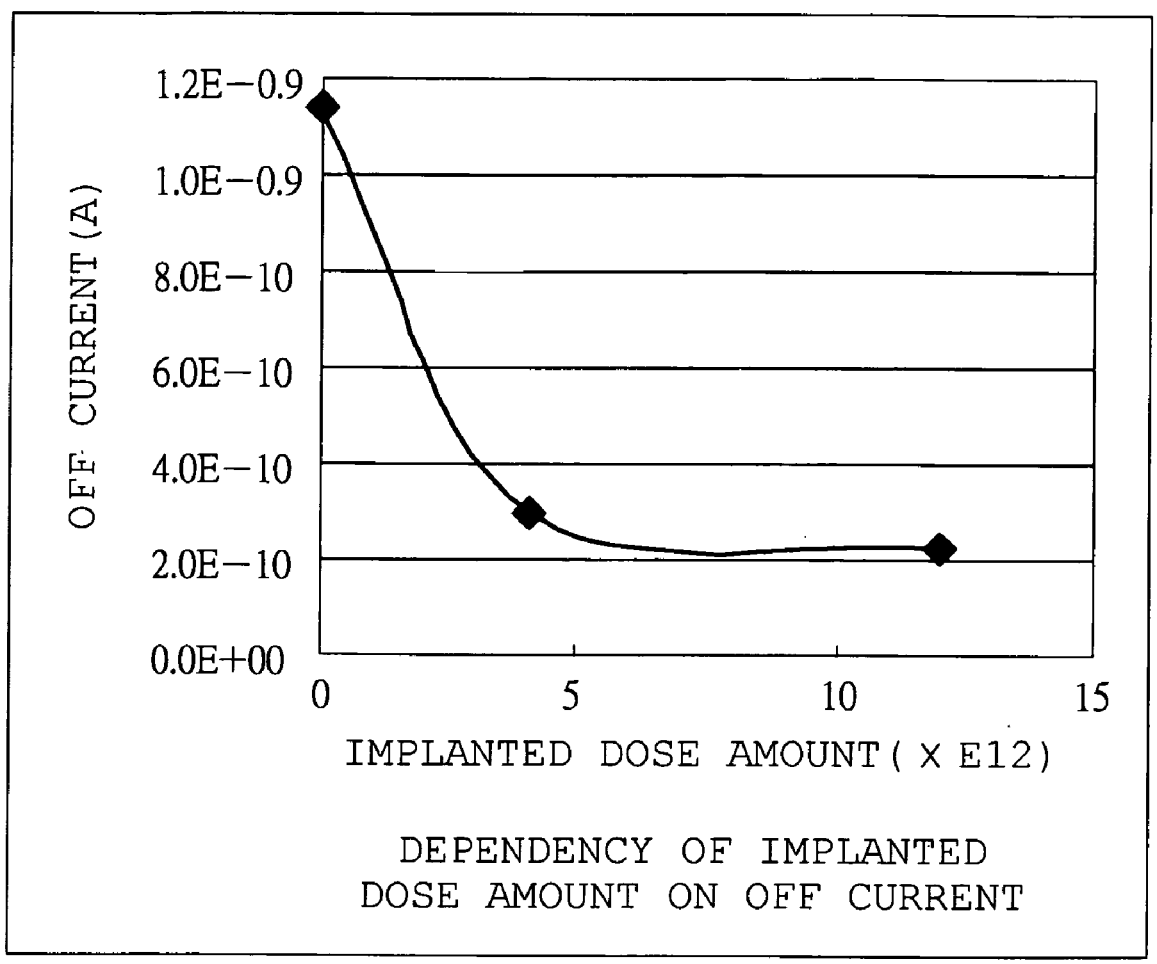
FIG. 11 is a graph showing dependency of an off current on a dose amount of impurities introduced into a channel forming region during the time when a MISFET is not operated.

FIG. 11 is a graph showing the measurement results of the relationship between the off current of the memory cell selecting MISFET and the dose amount of boron introduced into the poly-crystalline silicon film (channel forming region) 10. As shown in FIG. 11, this experiment has shown that the off current can be greatly reduced by setting the dose amount of boron to approximately $4 \times 10^{12}/cm^2$ or more.

Thus, since boron of an opposite conductivity type and phosphorus diffused from the n type poly-crystalline silicon film (source region) 7 into the poly-crystalline silicon film (channel forming region) 10 are counter-doped in this embodiment, it is possible to reduce the effective impurity concentration in the poly-crystalline silicon film (channel forming region) 10.

Figure 12:
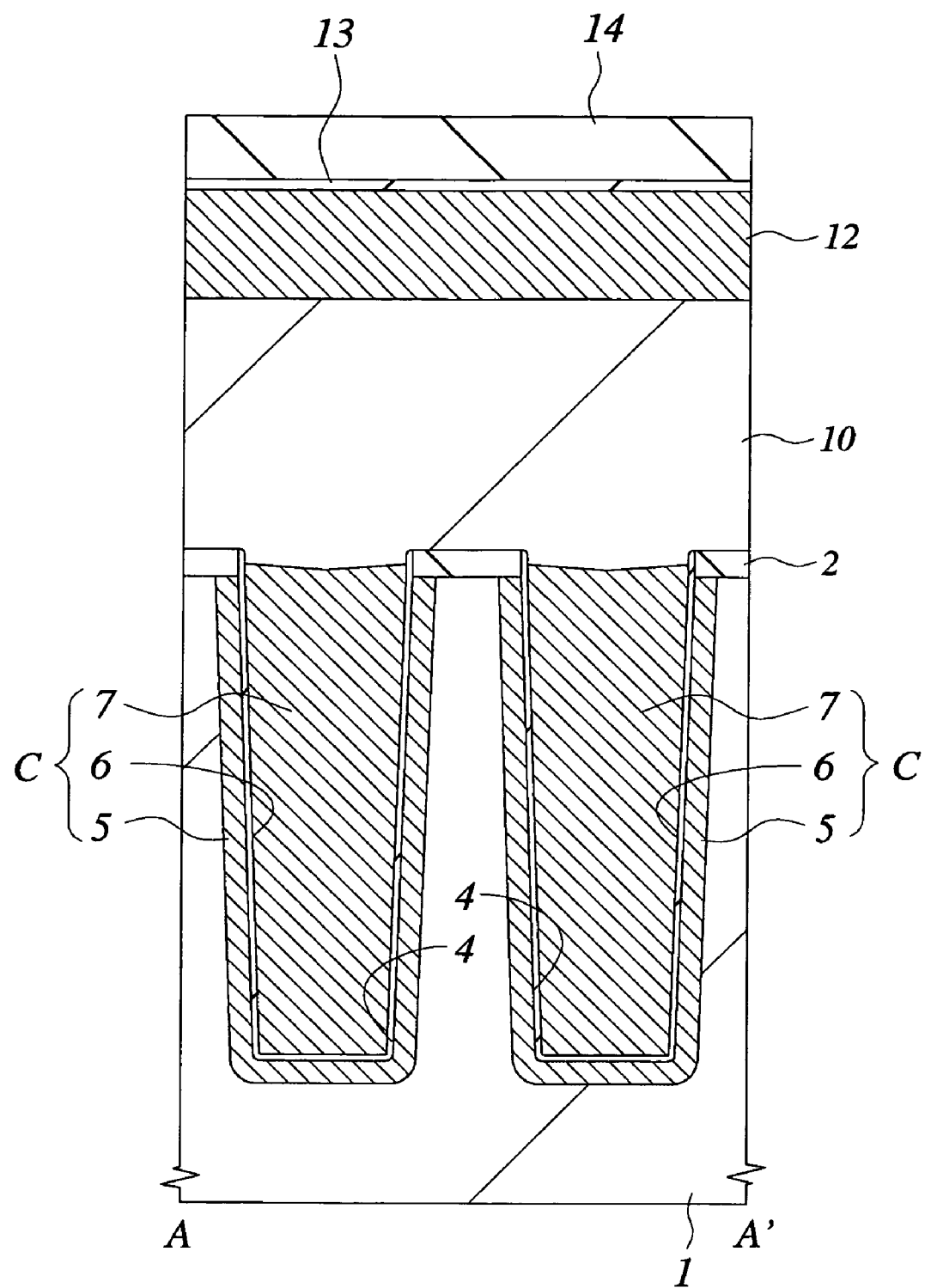
FIG. 12 is a sectional view showing a principal part of a semiconductor substrate in the semiconductor memory device manufacturing method according to the embodiment of the present invention.

Next, as shown in FIG. 12, an n type poly-crystalline silicon film (upper semiconductor layer) 12 doped with phosphorus is deposited on the poly-crystalline silicon film 10 by the CVD method. Thereafter, a silicon oxide film 13 and a silicon nitride film 14 are deposited on the poly-crystalline silicon film 12 by the CVD method. The thickness of the poly-crystalline silicon film 12 is approximately 200 nm, that of the silicon oxide film 13 is approximately 10 nm, and that of the silicon nitride film 14 is approximately 100 nm.

Figure 13:
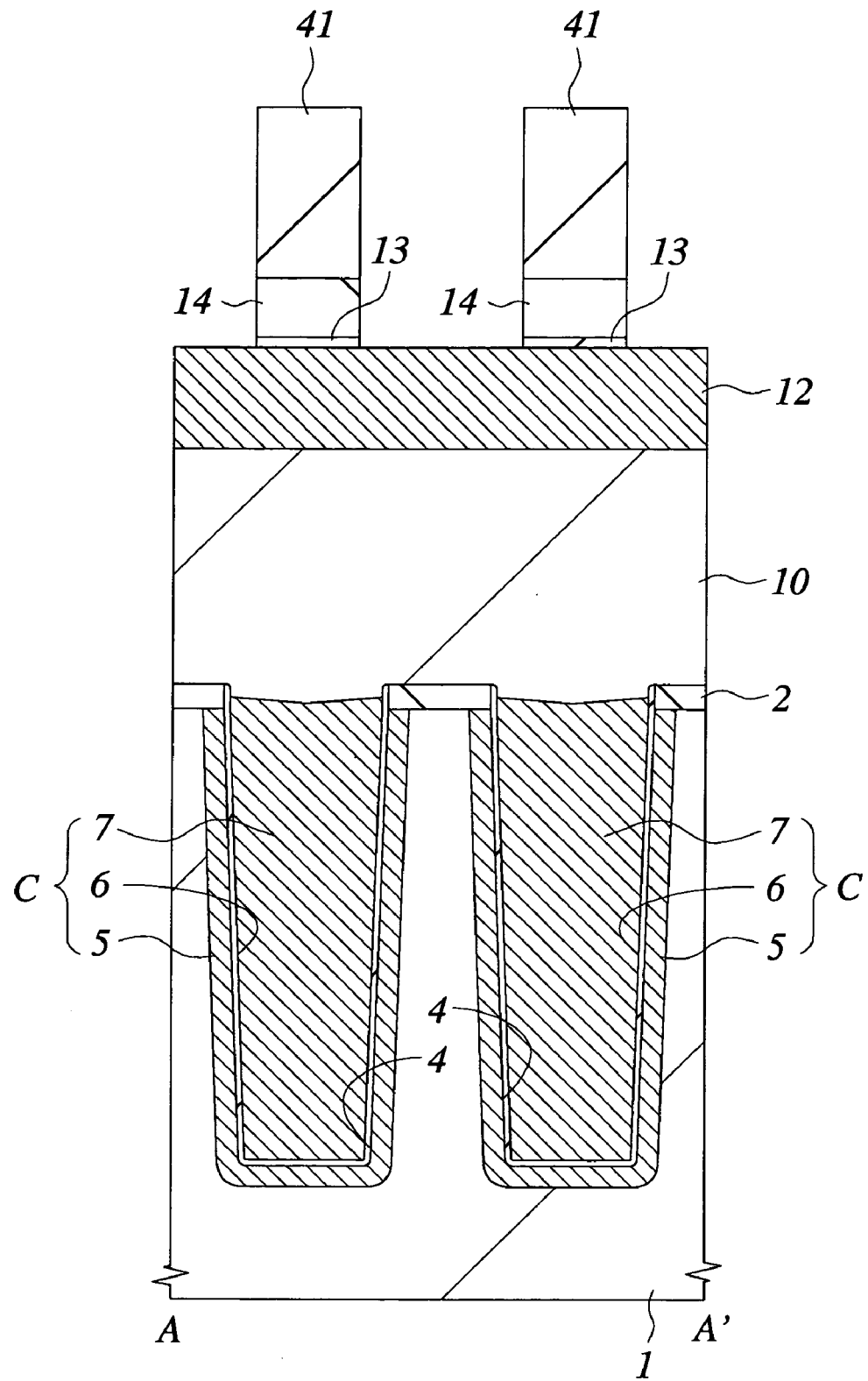
FIG. 13 is a sectional view showing a principal part of a semiconductor substrate in the semiconductor memory device manufacturing method according to the embodiment of the present invention.
Figure 14:
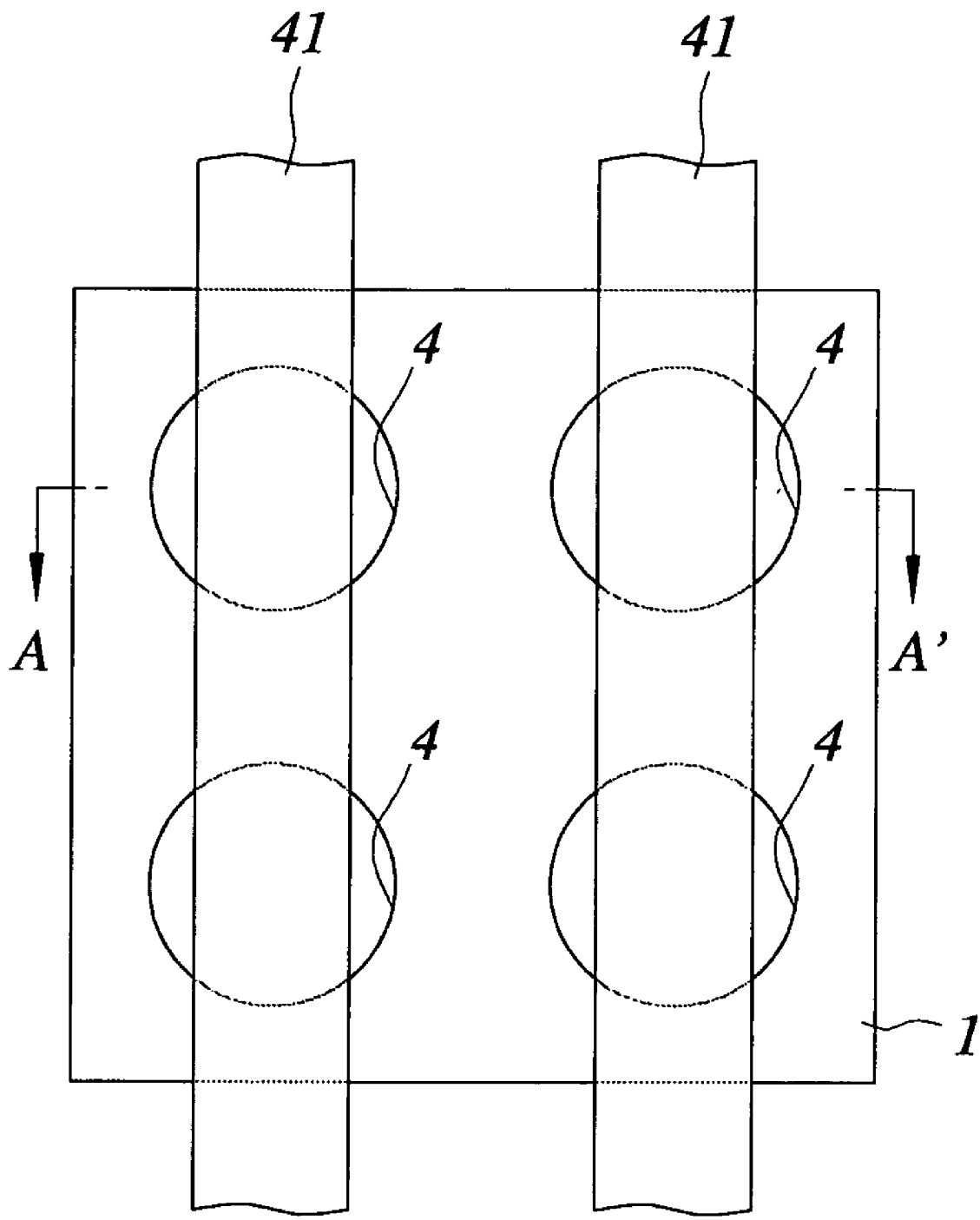
FIG. 14 is a plan view showing a principal part of a semiconductor substrate in the semiconductor memory device manufacturing method according to the embodiment of the present invention.

Next, as shown in FIG. 13, the silicon nitride film 14 and the silicon oxide film 13 are patterned by the dry etching with using a photoresist film 41 as a mask. As shown in FIG. 14, each photoresist film 41 has a strip pattern extending in a vertical direction of FIG. 14 across the upper portions of the trenches 4.

Figure 15:
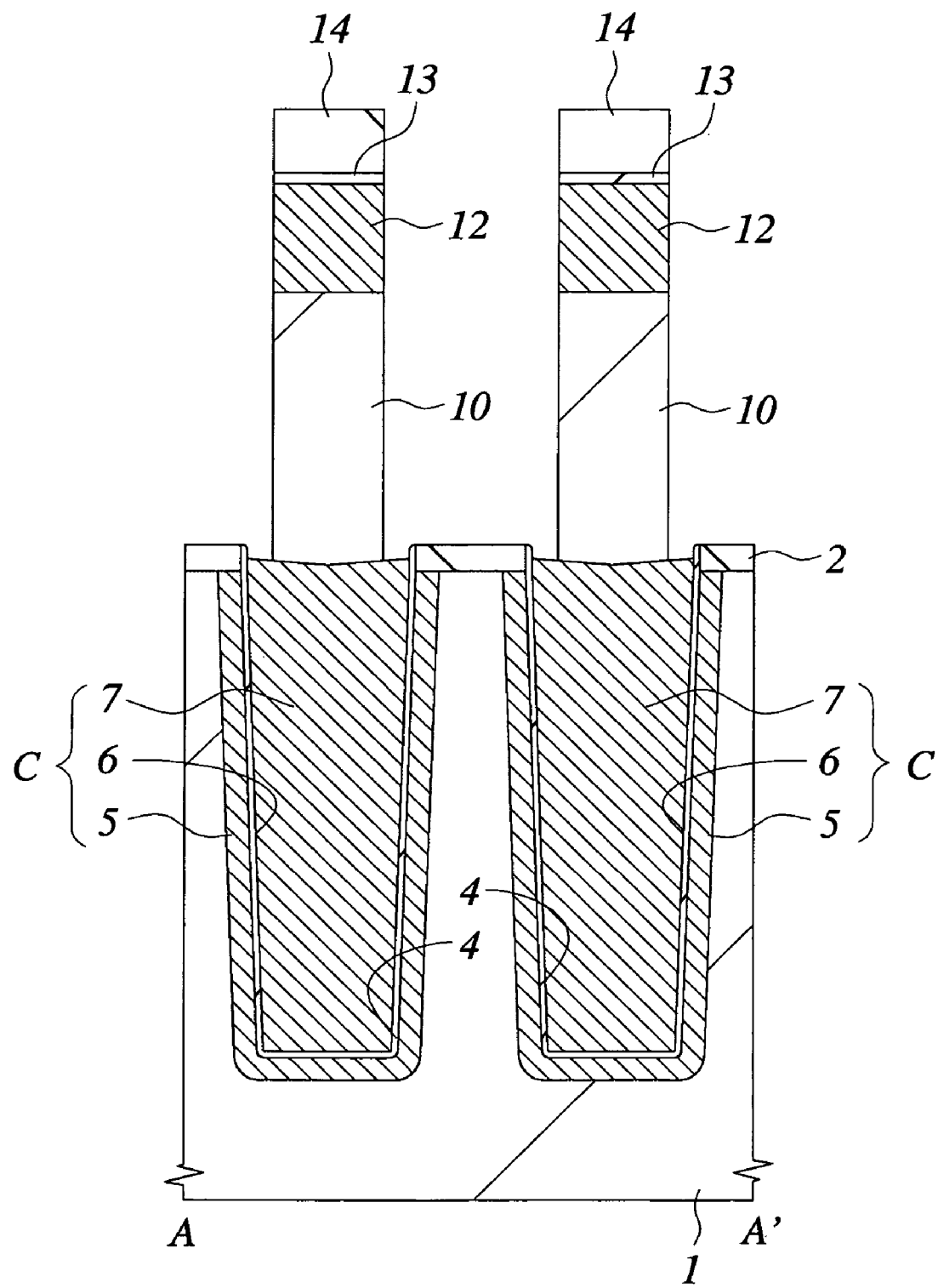
FIG. 15 is a sectional view showing a principal part of a semiconductor substrate in the semiconductor memory device manufacturing method according to the embodiment of the present invention.

Next, after removing the photoresist film 41 by the ashing, the poly-crystalline silicon film 12 and the poly-crystalline silicon film 10 are patterned by the dry etching with using the silicon nitride film 14 as a mask, as shown in FIG. 15. The poly-crystalline silicon films 10 and 12 patterned by the above-mentioned dry etching each have a strip pattern extending across the upper portions of the trenches 4 similarly to each photoresist film 41 shown in FIG. 14.

Figure 16:
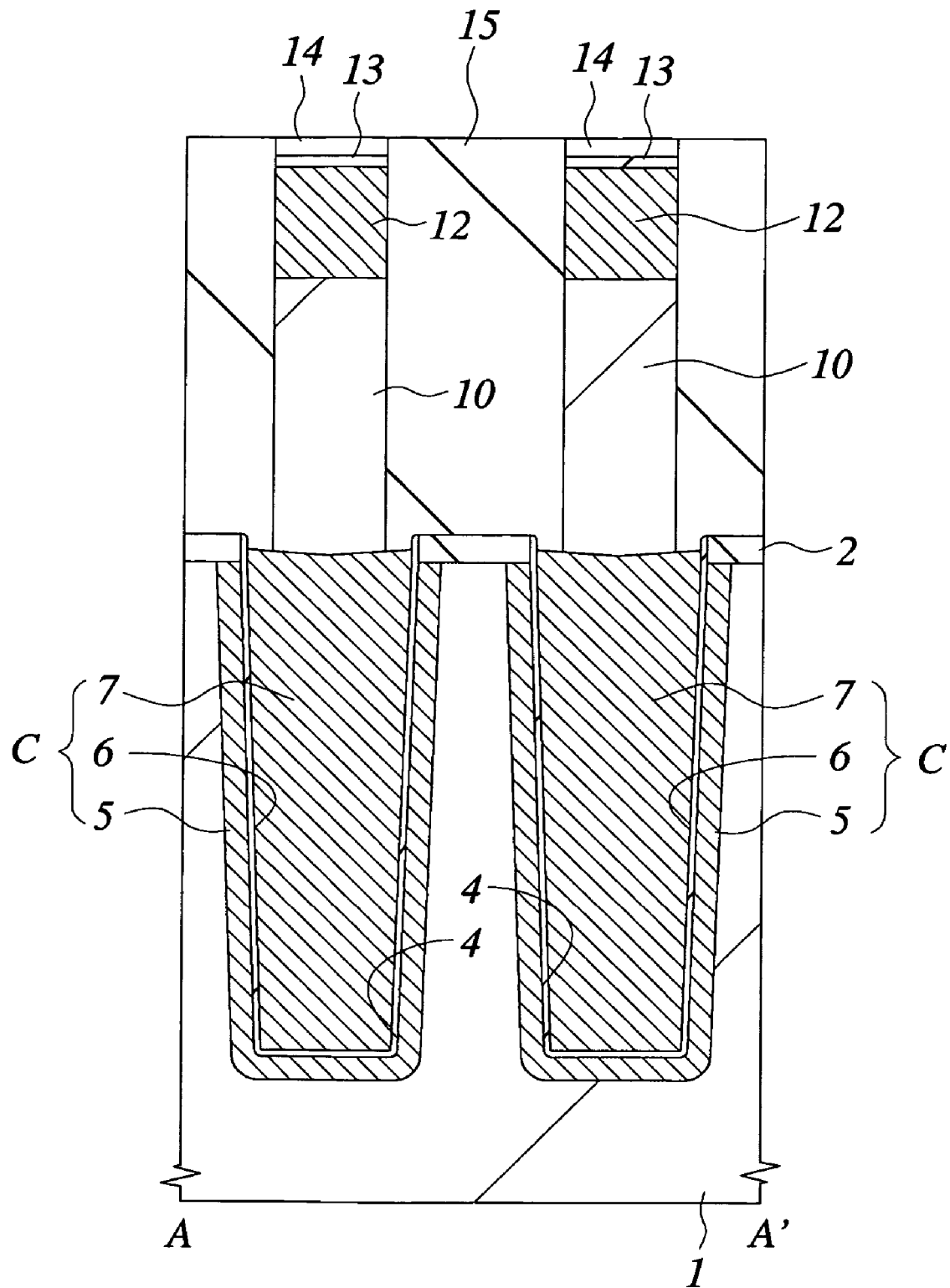
FIG. 16 is a sectional view showing a principal part of a semiconductor substrate in the semiconductor memory device manufacturing method according to the embodiment of the present invention.

Next, as shown in FIG. 16, a silicon oxide film 15 with a thickness of approximately 500 nm is deposited on the substrate 1 by the CVD method. Thereafter, the surface of the silicon oxide film 15 is planarized by the chemical mechanical polishing method. This polishing is finished at the time when the surface of the silicon nitride film 14 is exposed.

Figure 17:
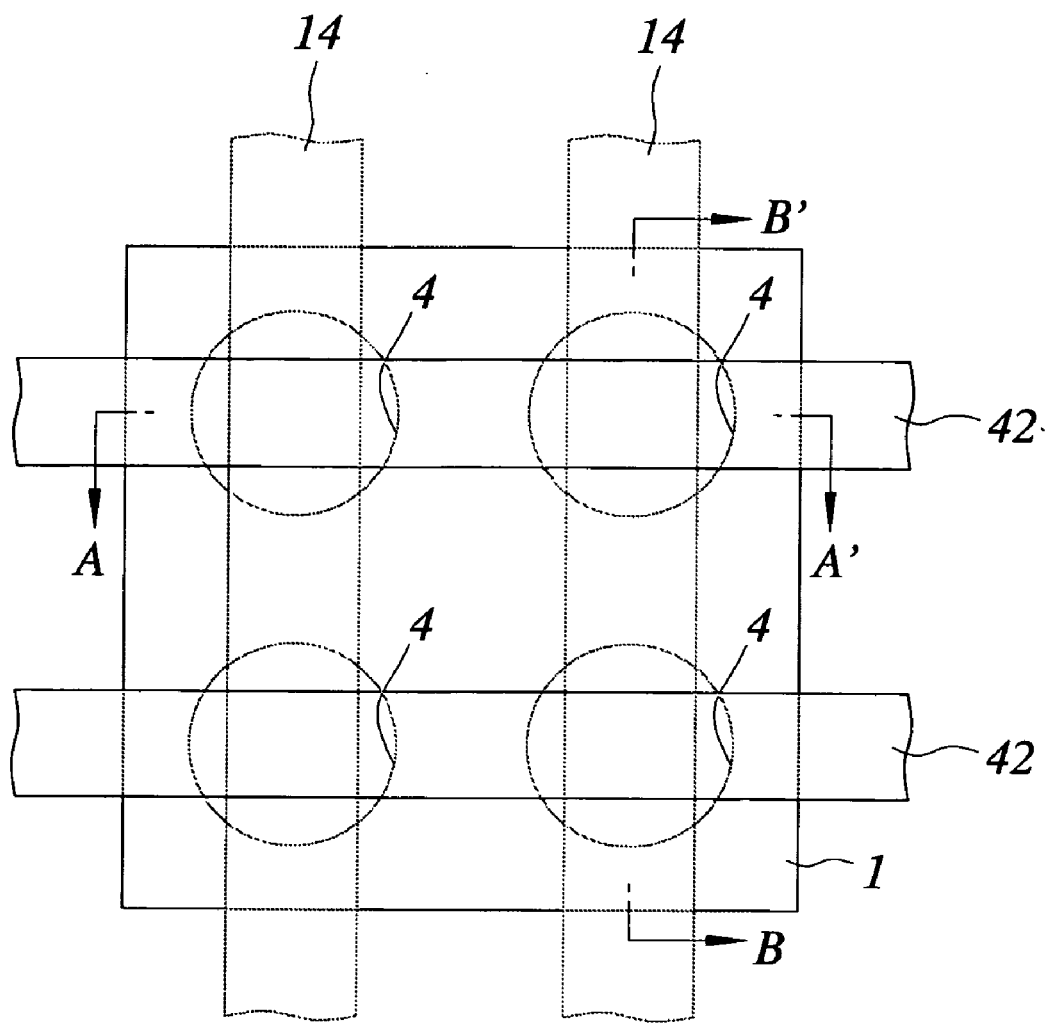
FIG. 17 is a plan view showing a principal part of a semiconductor substrate in the semiconductor memory device manufacturing method according to the embodiment of the present invention.
Figure 18:
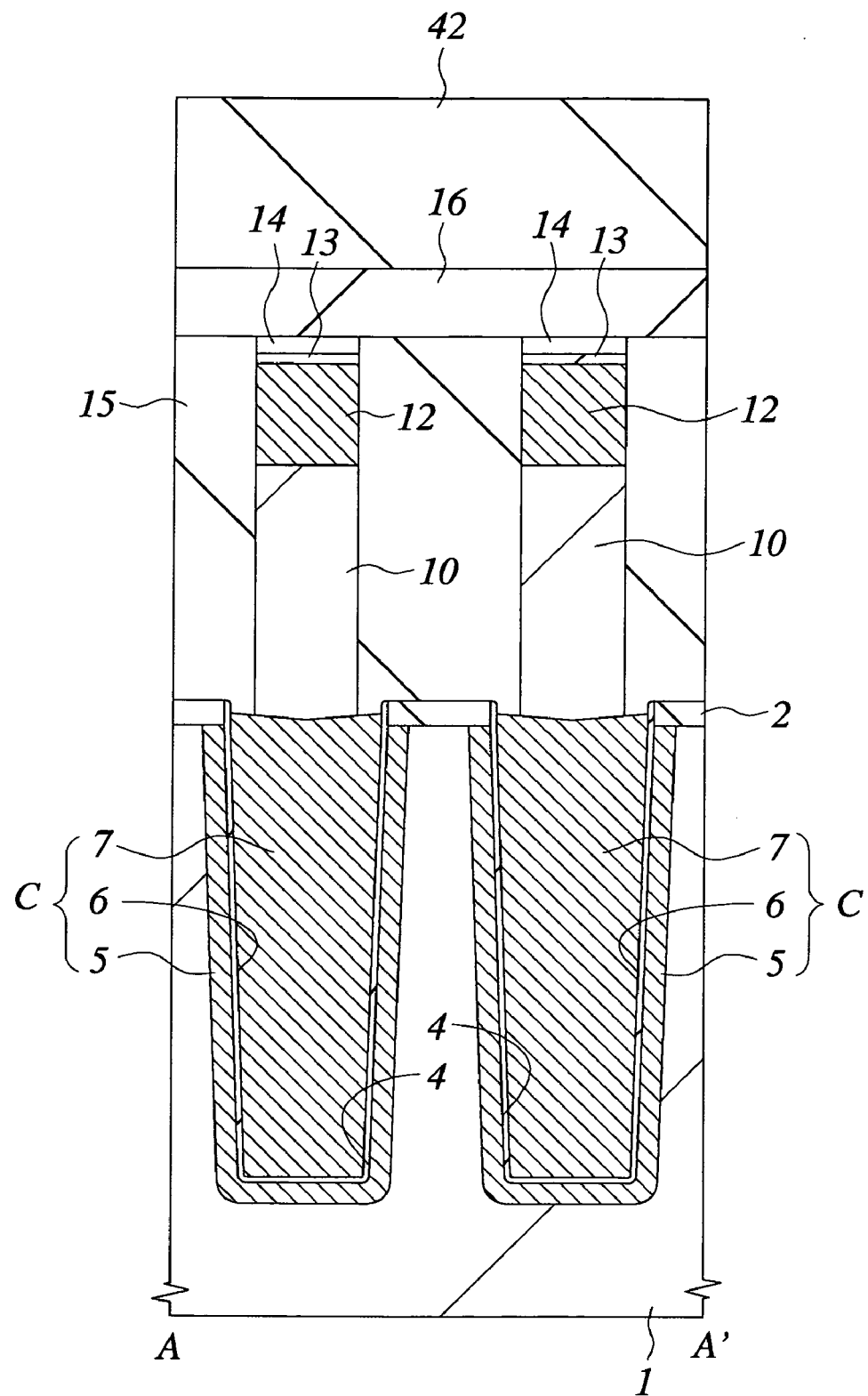
FIG. 18 is a sectional view showing a principal part of a semiconductor substrate in the semiconductor memory device manufacturing method according to the embodiment of the present invention.
Figure 19:
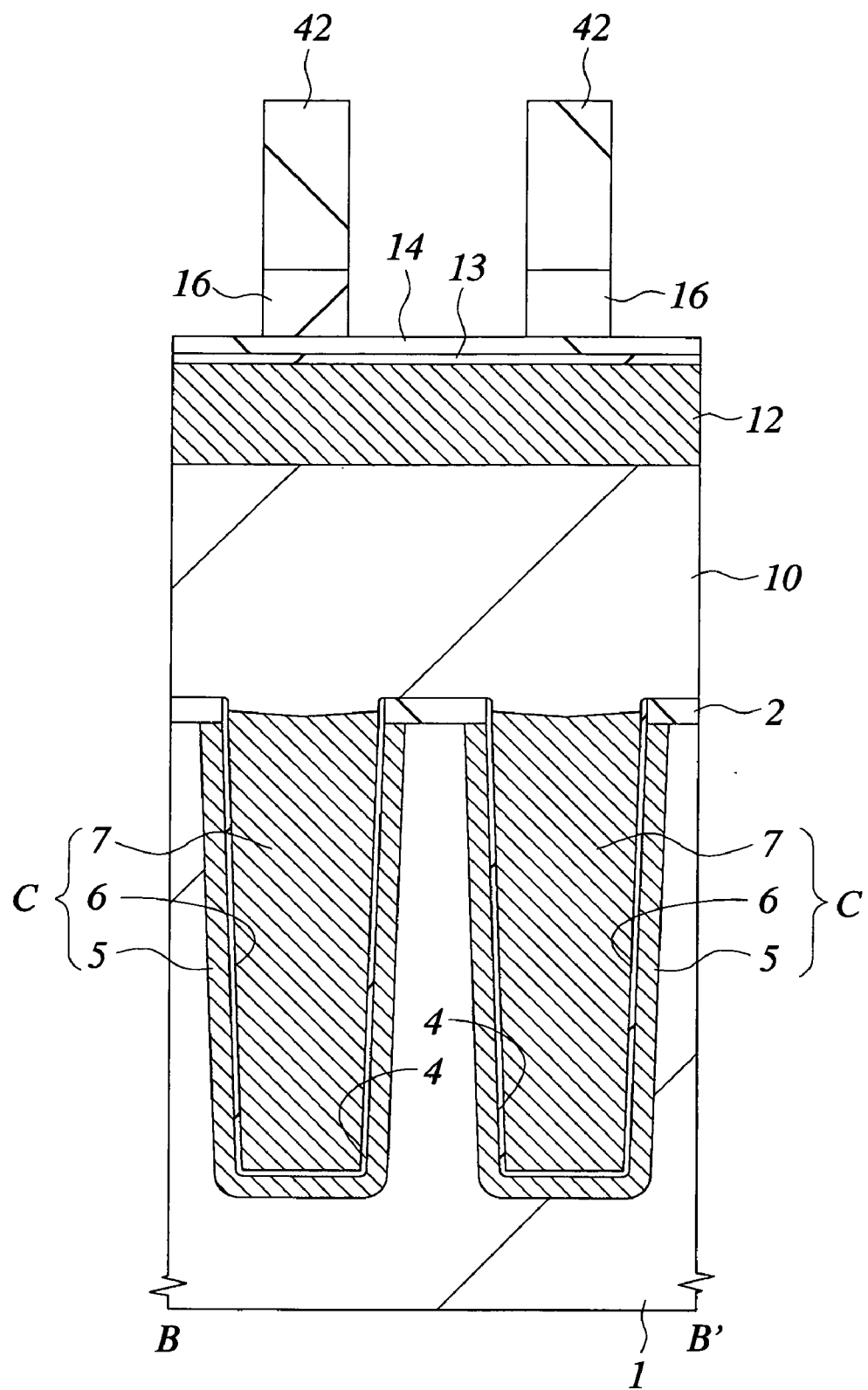
FIG. 19 is a sectional view showing a principal part of a semiconductor substrate in the semiconductor memory device manufacturing method according to the embodiment of the present invention.

Next, as shown in FIGS. 17, 18, and 19 (sectional view taken along the line B–B' in FIG. 17), after a silicon oxide film 16 with a thickness of approximately 100 to 150 nm is deposited on the silicon oxide film 15 by the CVD method, the silicon oxide film 16 is patterned by the dry etching with using a photoresist film 42 as a mask. As shown in FIG. 17, the photoresist films 42 each has a strip pattern extending in a horizontal direction of FIG. 17 across the upper portions of the trenches 4.

Figure 20:
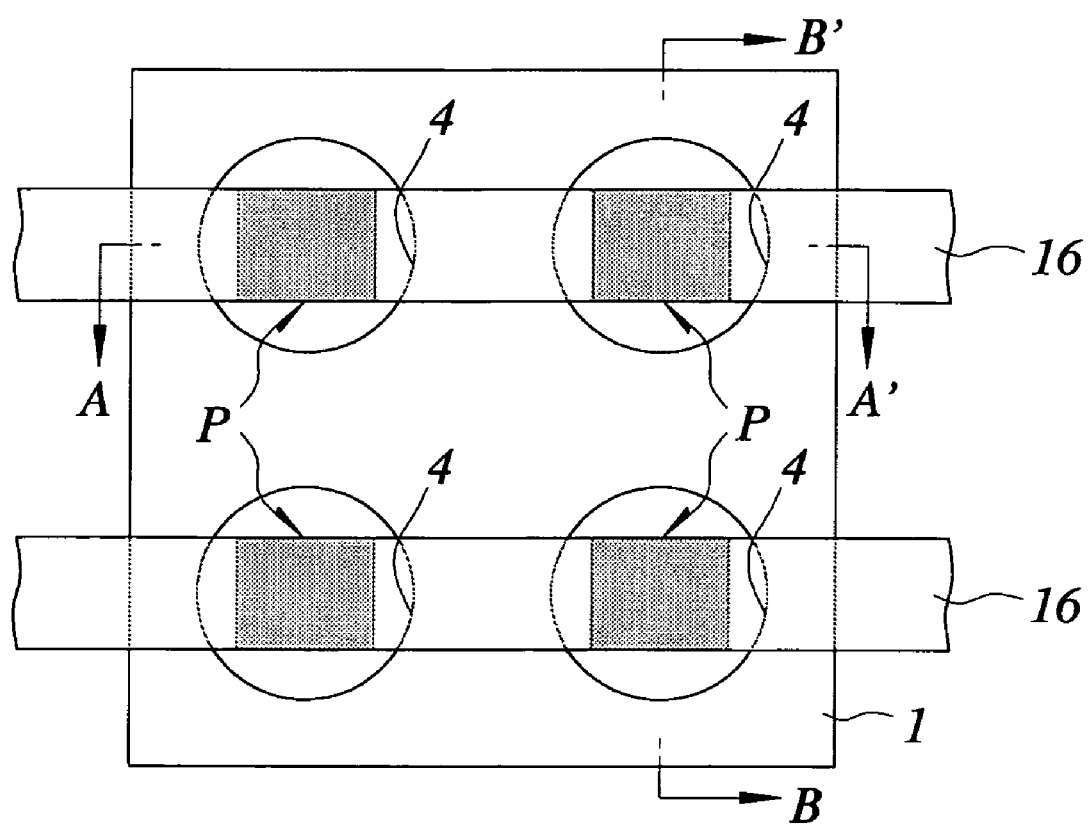
FIG. 20 is a plan view showing a principal part of a semiconductor substrate in the semiconductor memory device manufacturing method according to the embodiment of the present invention.
Figure 21:
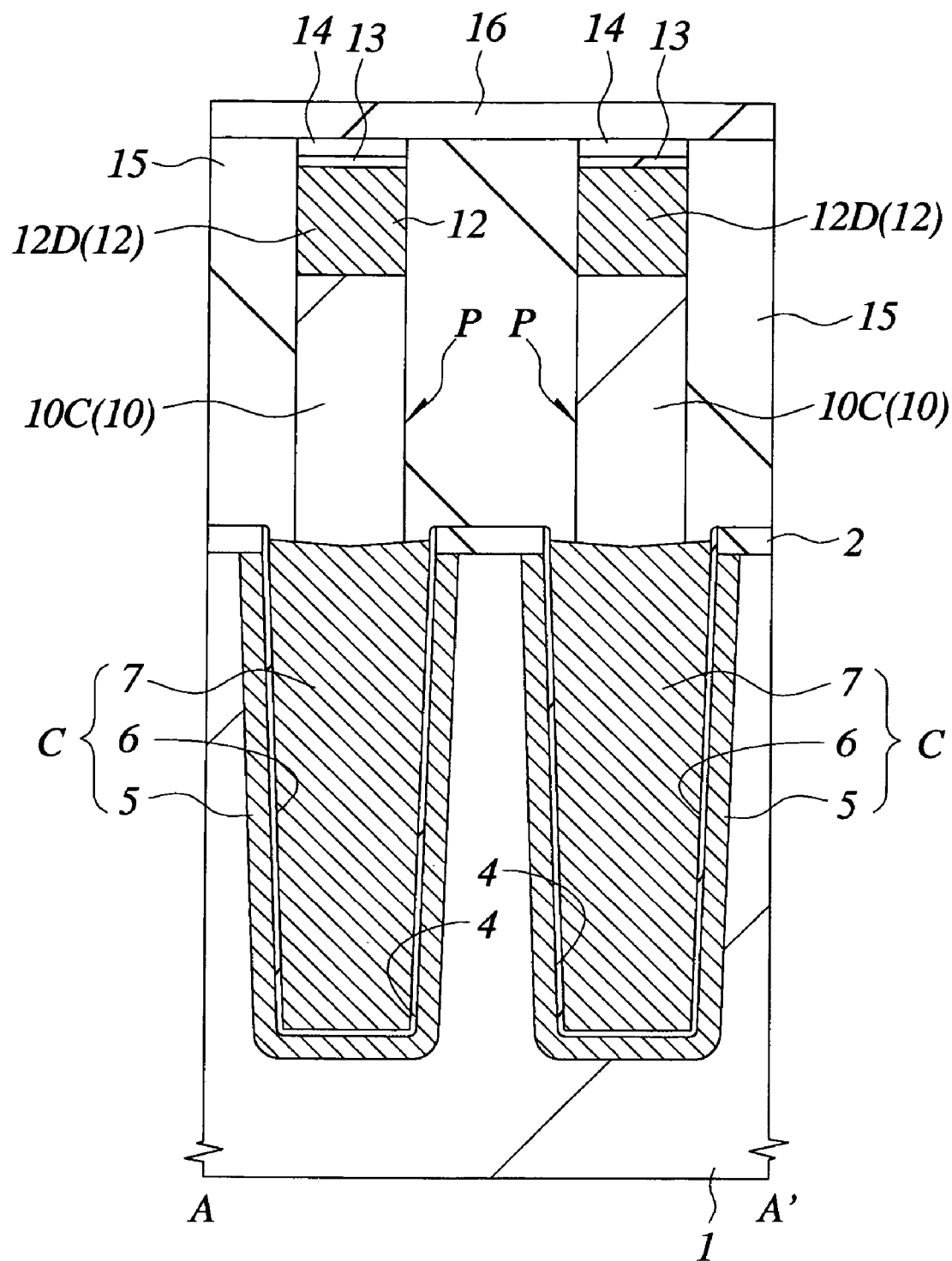
FIG. 21 is a sectional view showing a principal part of a semiconductor substrate in the semiconductor memory device manufacturing method device according to the embodiment of the present invention.
Figure 22:
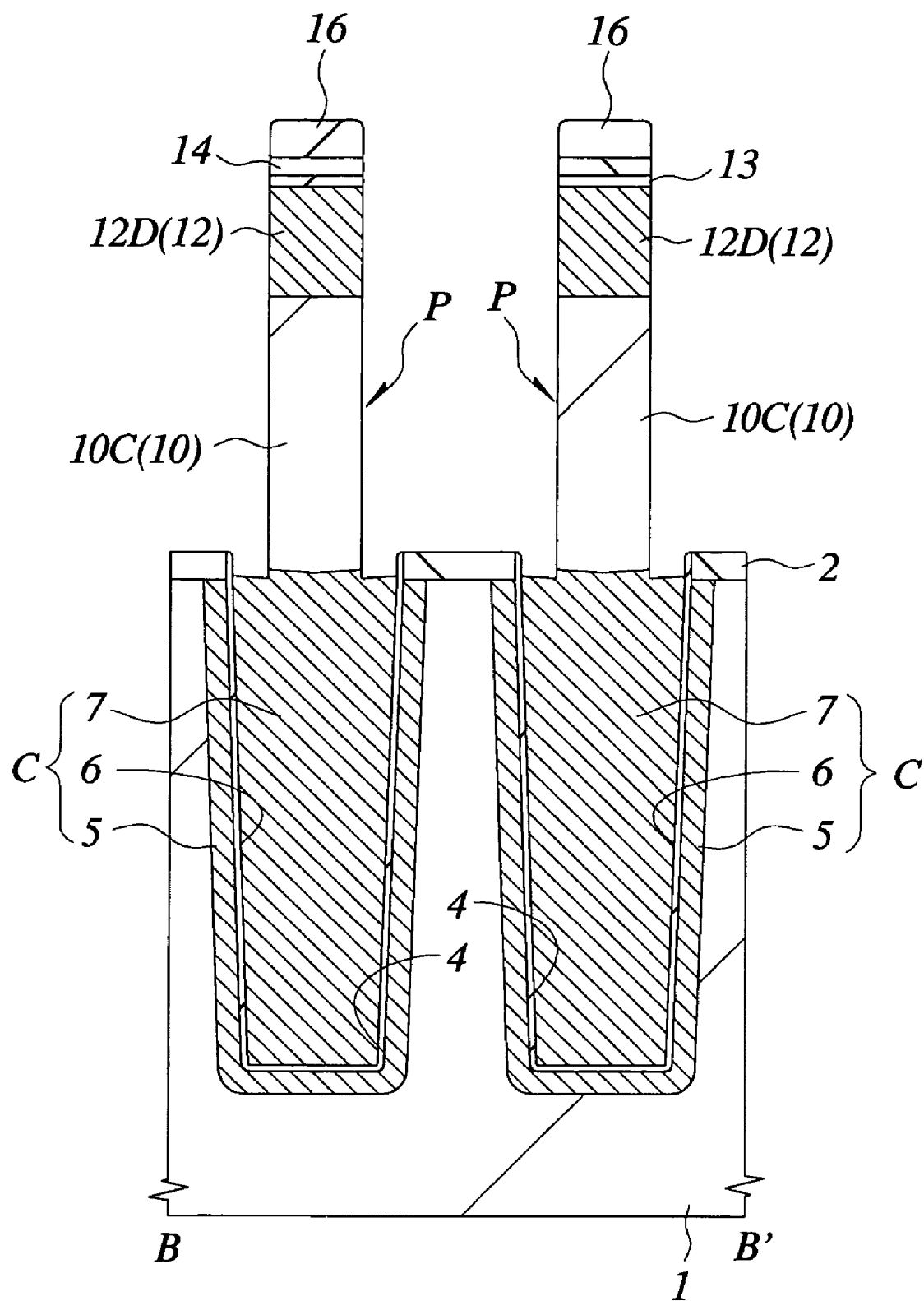
FIG. 22 is a sectional view showing a principal part of a semiconductor substrate in the semiconductor memory device manufacturing method according to the embodiment of the present invention.

Next, after removing the photoresist film 42 by the ashing, the poly-crystalline silicon film 12 and the poly-crystalline silicon film 10 are patterned by the dry etching with using the strip-patterned silicon nitride film 16 as a mask, as shown in FIGS. 20, 21, and 22.

After the above-mentioned dry etching, a quadratic-prism laminated structure P, in which the poly-crystalline silicon film 10, the poly-crystalline silicon film 12, the silicon oxide film 13, and the silicon nitride film 14 are laminated in this order, is formed on the capacitor C. Additionally, by forming this laminated structure P, a channel forming region 10C composed of the poly-crystalline silicon film 10 and a drain region 12D composed of the poly-crystalline silicon film 12 laminated thereon are formed. Two sidewalls (left and right sidewalls in FIG. 20) of the laminated structure P are covered with the silicon oxide film 15, as shown in FIG. 21. However, the surfaces of the other two sidewalls (upper and lower sidewalls in FIG. 20) are exposed, as shown in FIG. 22. In this state, boron (or $BF_2$), which is of a conductivity type opposite to that of phosphorus, is introduced by the ion implantation method in order to reduce the impurity concentration in the poly-crystalline silicon film of the channel forming region. Boron (or $BF_2$) is implanted from an oblique direction of an angle of 0° to 90° with respect to the main surface of the substrate 1. In this ion implantation from the oblique direction, for example, the semiconductor substrate 1 is preferably rotated every 90° with respect to an axis vertical to the main surface of the semiconductor substrate 1. Additionally, the dose amount of the p type impurity in this ion implantation is controlled so that the concentration of the p type impurity introduced into the channel forming region (poly-crystalline silicon film) can be equal to or slightly higher than that of phosphorus diffused from the drain region into the channel forming region.

Figure 23:
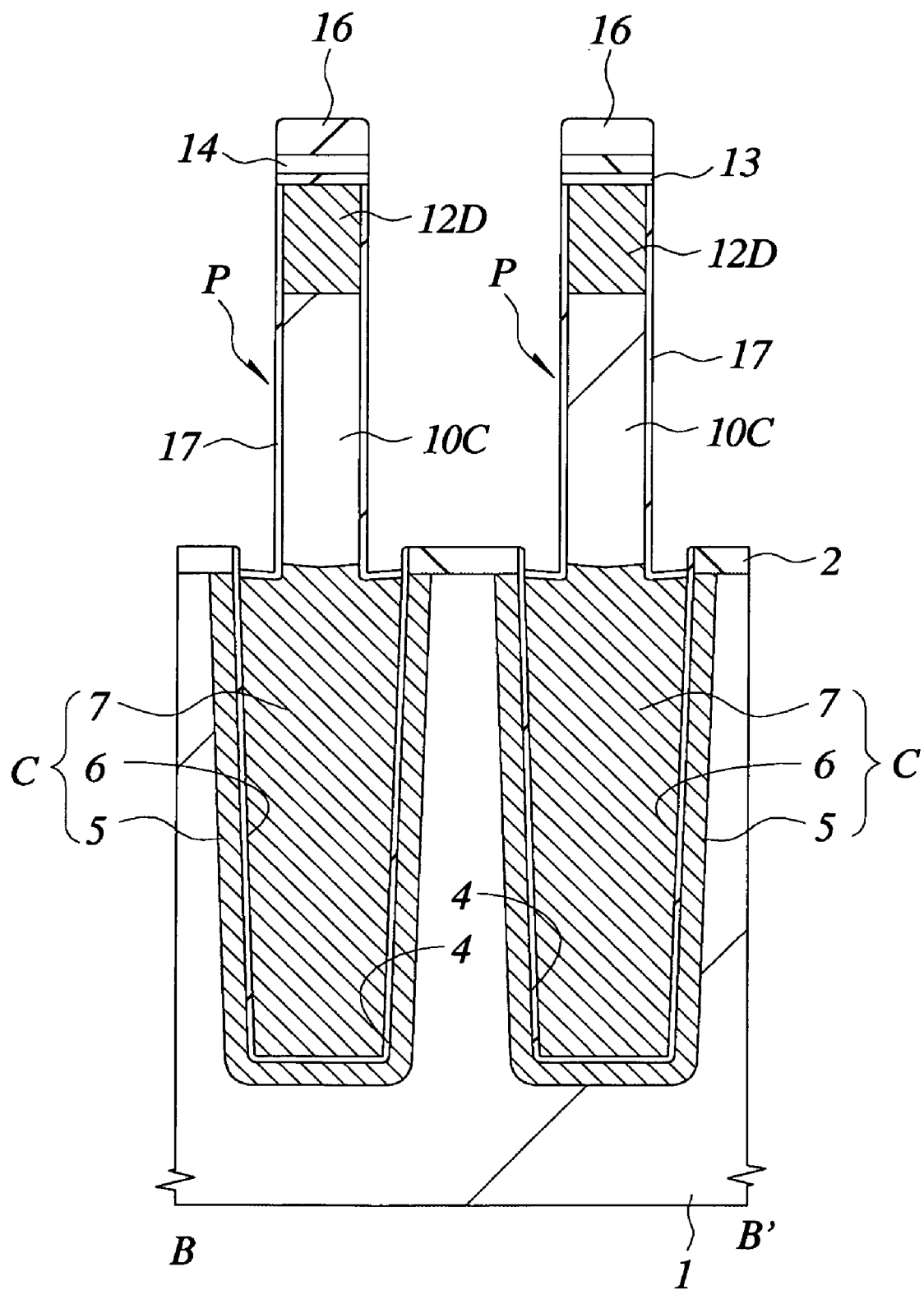
FIG. 23 is a sectional view showing a principal part of a semiconductor substrate in the semiconductor memory device manufacturing method according to the embodiment of the present invention.

Next, as shown in FIG. 23, a gate insulating film 17 composed of a silicon oxide film with a thickness of approximately 10 nm is formed on the sidewalls of the laminated structure P (sidewalls not covered with the silicon oxide film 15) by the thermal treatment of the substrate 1 in an oxidizing atmosphere. The silicon oxide film constituting the gate insulating film 17 can be deposited by the CVD method. However, a better quality film better in quality and fewer in defect can be obtained by thermal oxidation of the surfaces of the poly-crystalline silicon films (10C and 12D).

Figure 24:
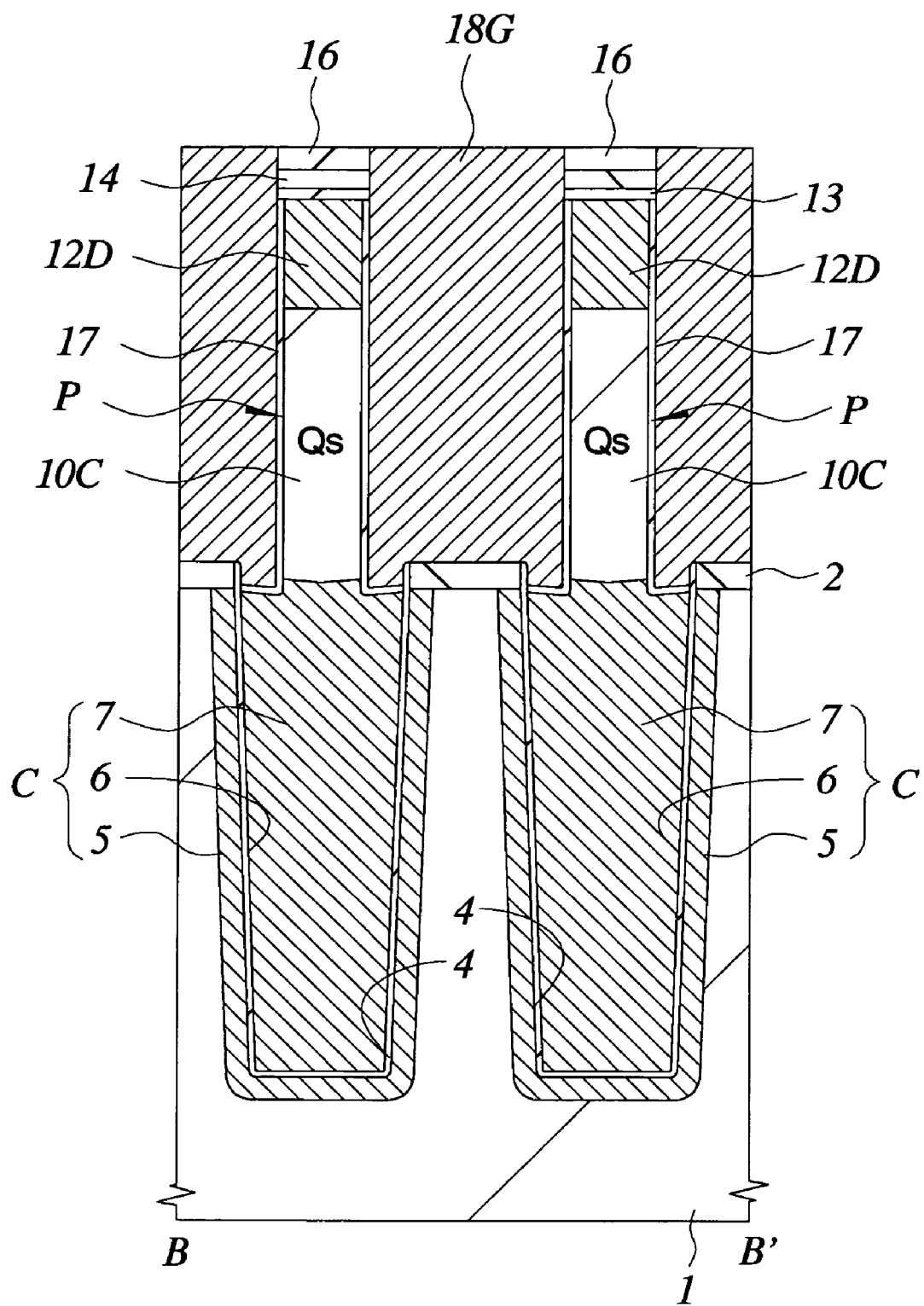
FIG. 24 is a sectional view showing a principal part of a semiconductor substrate in the semiconductor memory device manufacturing method according to the embodiment of the present invention.

Next, as shown in FIG. 24, a gate electrode 18G is formed in a gap between the adjacent laminated structures P. By so doing, the memory cell selecting MISFET Qs composed of the source region (poly-crystalline silicon film 7), the channel forming region 10C, the drain region 12D, the gate insulating film 17, and the gate electrode 18G is completed. The gate electrode 18G is formed in the following manner. That is, after a p type poly-crystalline silicon film doped with boron is deposited on the substrate 1 by the CVD method, the poly-crystalline silicon film is polished and planarized by the chemical mechanical polishing until the surface of the silicon oxide film 16 is exposed.

Through the process described so far, the memory cell of the DRAM composed of the capacitor C and the memory cell selecting MISFET Qs formed thereon is almost completed.

In the first embodiment, the ion implantation is performed twice, that is, the vertical ion implantation into the structure shown in FIG. 10 and the oblique ion implantation into the structure shown in FIG. 22.

The vertical ion implantation shown in FIG. 10 counteracts the impurities in the channel and further the concentration of the channel itself can be made stable by polarity opposite to that of its impurities. Therefore, reproducibility of the threshold current and the off current due to the complete depletion can be improved.

Since the oblique ion implantation into the structure shown in FIG. 22 is performed after the high-temperature thermal treatment, profile in the channel is hardly broken. (Note that, if the ion implantation is performed after forming the gate insulating film shown in FIG. 23, the defects generated in the ion implantation are left in the gate insulator and, therefore, it is preferable to perform the ion implantation into the structure shown in FIG. 23). For this reason, it is possible to effectively control the threshold voltage and improve a depletion ratio thereof.

Although the reduction of the off current caused by the complete depletion and the reduction of the threshold voltage variation can be achieved by performing either of the two ion implantations, it is more preferable to perform both of the two ion implantations in view of the reproducibility and the controllability.

thus, in the first embodiment, since it is possible to reduce the effective impurity concentration in the channel forming region 10C of the memory cell selecting MISFET Qs, the channel forming region 10C can be completely depleted when the memory cell is not operated. Therefore, it is possible to manufacture the DRAM in which the off current (leakage current) is less. Additionally, since it is possible to control the variation of the threshold voltage of the memory cell selecting MISFET Qs, the reliability of the DRAM can be improved.

(Second Embodiment)

In this embodiment, the present invention is applied to a p channel and vertical MISFET, and the manufacturing method thereof will be described in order of process with reference to FIGS. 25 to 35.

Figure 25:
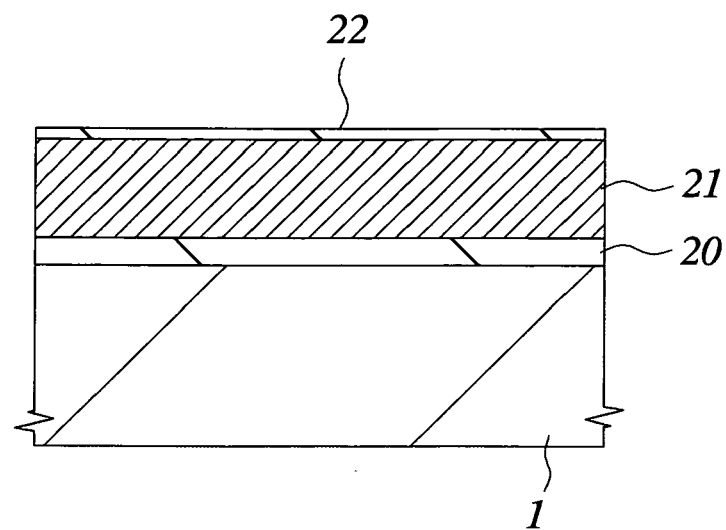
FIG. 25 is a sectional view showing a principal part of a semiconductor substrate in a MISFET manufacturing method according to another embodiment of the present invention.

First, as shown in FIG. 25, a silicon oxide film 20 with a thickness of approximately 200 nm is deposited on the substrate 1 by the CVD method, and subsequently a p type poly-crystalline silicon film (lower semiconductor layer) 21 having a thickness of approximately 300 nm and doped with boron is deposited on the silicon oxide film 20 by the CVD method. Thereafter, the thermal treatment of the substrate 1 is performed in an atmosphere containing a $NH_3$ gas. By so doing, a thin silicon nitride film 22 with a thickness of approximately 1 to 2 nm is formed on the surface of the poly-crystalline silicon film 21. This silicon nitride film 22 functions as a barrier film for preventing the impurity (boron) in the poly-crystalline silicon film 21 from diffusing into the channel forming region formed thereon.

Figure 26:
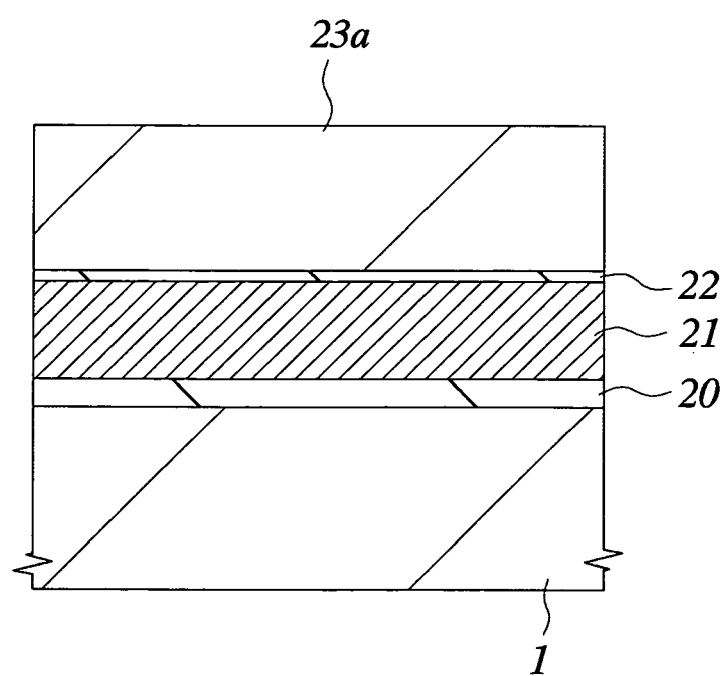
FIG. 26 is a sectional view showing a principal part of a semiconductor substrate in the MISFET manufacturing method according to another embodiment of the present invention.

Next, as shown in FIG. 26, an amorphous silicon film (intermediate semiconductor layer) 23a with a thickness of approximately 400 nm is deposited on the silicon nitride film 22 by the CVD method. This amorphous silicon film 23a is made of amorphous silicon with an impurity concentration of $1 \times 10^{16}$/cm$^3$ or less or undoped amorphous silicon containing substantially no impurity.

Figure 27:
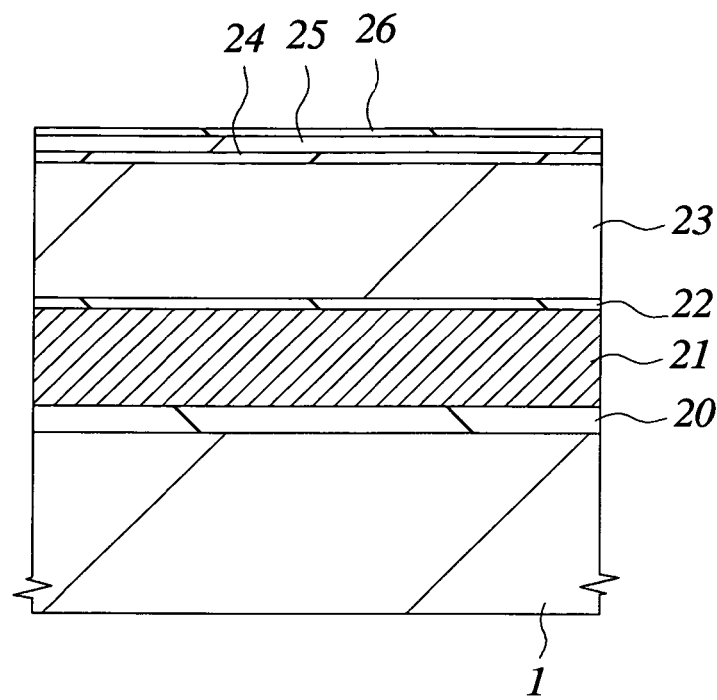
FIG. 27 is a sectional view showing a principal part of a semiconductor substrate in the MISFET manufacturing method according to another embodiment of the present invention.

Next, as shown in FIG. 27, the thermal treatment of the substrate 1 is performed at a high temperature of approximately 800° C. to convert the above-mentioned amorphous silicon film 23a to a poly-crystalline silicon film 23, and subsequently the thermal treatment of the substrate 1 is performed in the atmosphere containing a $NH_3$ gas. By so doing, a thin silicon nitride film 24 with a thickness of approximately 1 to 2 nm is formed on the surface of the poly-crystalline silicon film 23. Thereafter, an undoped poly-crystalline silicon film (or amorphous silicon film) 25 with a thickness of approximately 30 nm and a silicon oxide film 26 with a thickness of approximately 10 nm are deposited on the silicon nitride film 24 by the CVD method. The above-mentioned silicon nitride film 24 functions as a barrier layer for preventing an impurity (boron) in the drain region formed on the poly-crystalline silicon film 23 to be the channel forming region from diffusing into the poly-crystalline silicon film 23.

By the above-mentioned thermal treatment for converting the amorphous silicon film 23a to the poly-crystalline silicon film 23, a part of boron contained in the p type poly-crystalline silicon film 21 formed under the poly-crystalline silicon film 23 passes through the thin silicon nitride film 22 and is thermally diffused in the poly-crystalline silicon film 23, and the impurity concentration in the poly-crystalline silicon film 23 is increased. Therefore, it becomes difficult to achieve the complete depletion of the channel forming region composed of the poly-crystalline silicon film 23. Additionally, the threshold voltage of the MISFET is varied due to the diffusion of phosphorus into the channel forming region, whereby there arises the problem that the operation of the memory cell becomes unstable.

Figure 28:
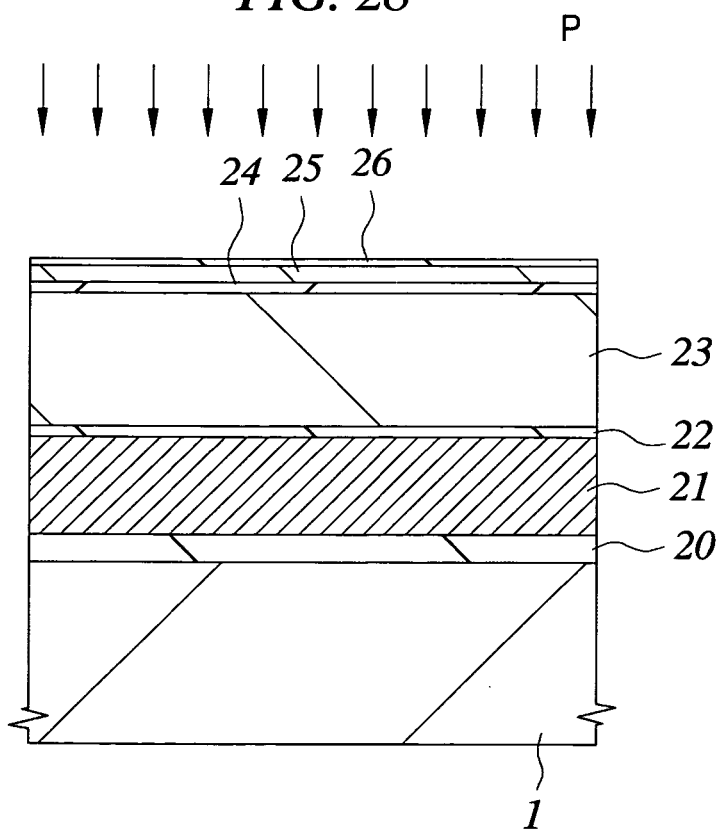
FIG. 28 is a sectional view showing a principal part of a semiconductor substrate in the MISFET manufacturing method according to another embodiment of the present invention.

So, an n type impurity of opposite conductivity type to that of boron (e.g., phosphorus, arsenic, or antimony) is introduced to the poly-crystalline silicon film 23, as shown in FIG. 28. In this introduction of the n type impurity, the ion implantation method in which the n type impurity is vertically implanted into the main surface of the substrate 1 may be used, and the implantation energy may be controlled so that the impurity concentration around the central portion of the poly-crystalline silicon film 23 can be lower than those above and below the central portion. Also, the dose amount of the n type impurity is controlled so that the concentration of the n type impurity introduced into the poly-crystalline silicon film 23 can be equal to or slightly higher than that of boron diffused in the poly-crystalline silicon film 10.

Thus, in this embodiment, since boron diffused from the p type poly-crystalline silicon film 21 into the poly-crystalline silicon film 23 and the n type impurity of an opposite conductivity type are counter-doped, it is possible to reduce the effective impurity concentration in the poly-crystalline silicon film 23.

Figure 29:
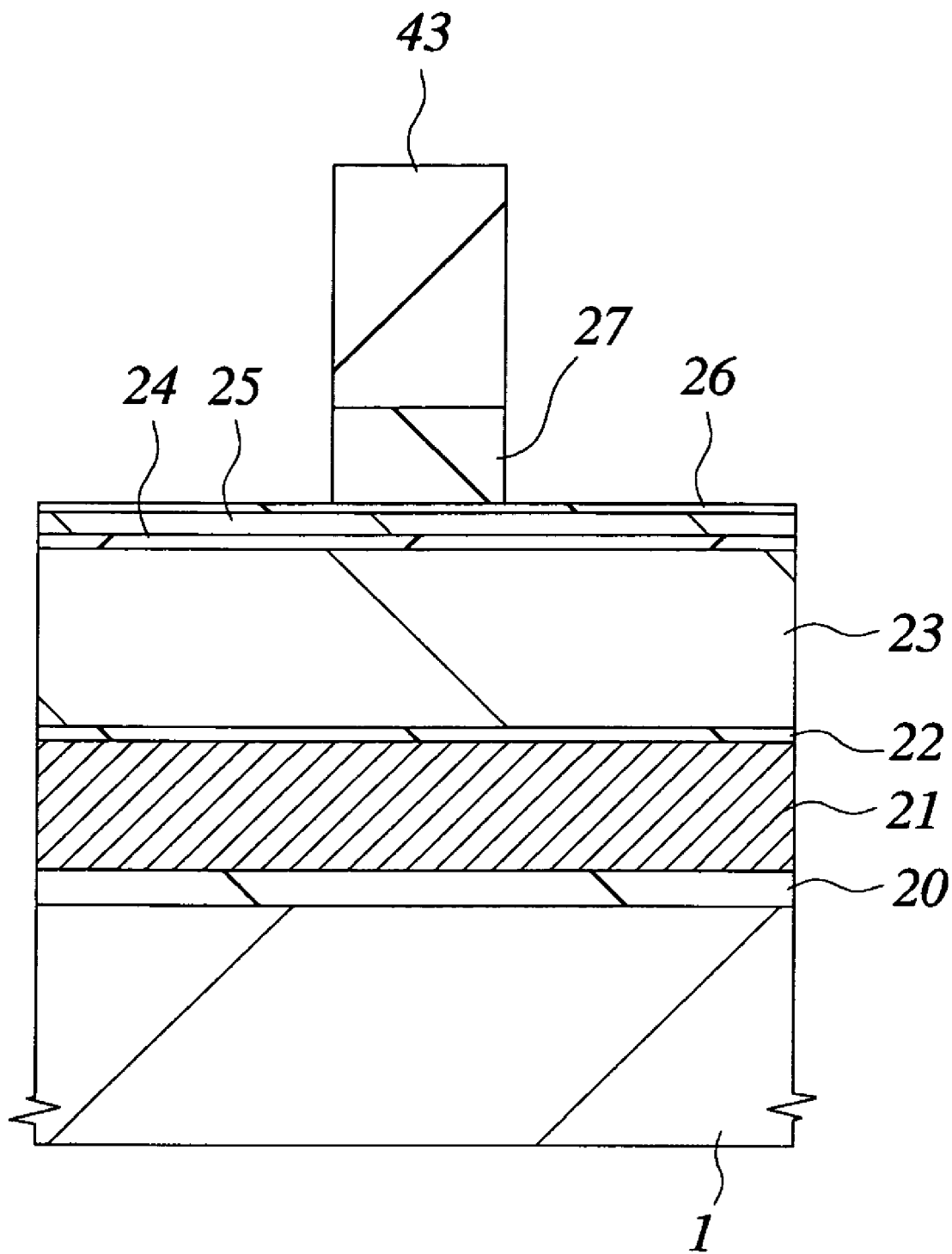
FIG. 29 is a sectional view showing a principal part of a semiconductor substrate in the MISFET manufacturing method according to another embodiment of the present invention.

Next, as shown in FIG. 29, after a silicon nitride film 27 with a thickness of approximately 150 to 200 nm is deposited on the silicon oxide film 26 by the CVD method, the silicon nitride film 27 is patterned by the dry etching with using, as a mask, a photoresist film 43 having a quadratic-prism plan pattern.

Figure 30:
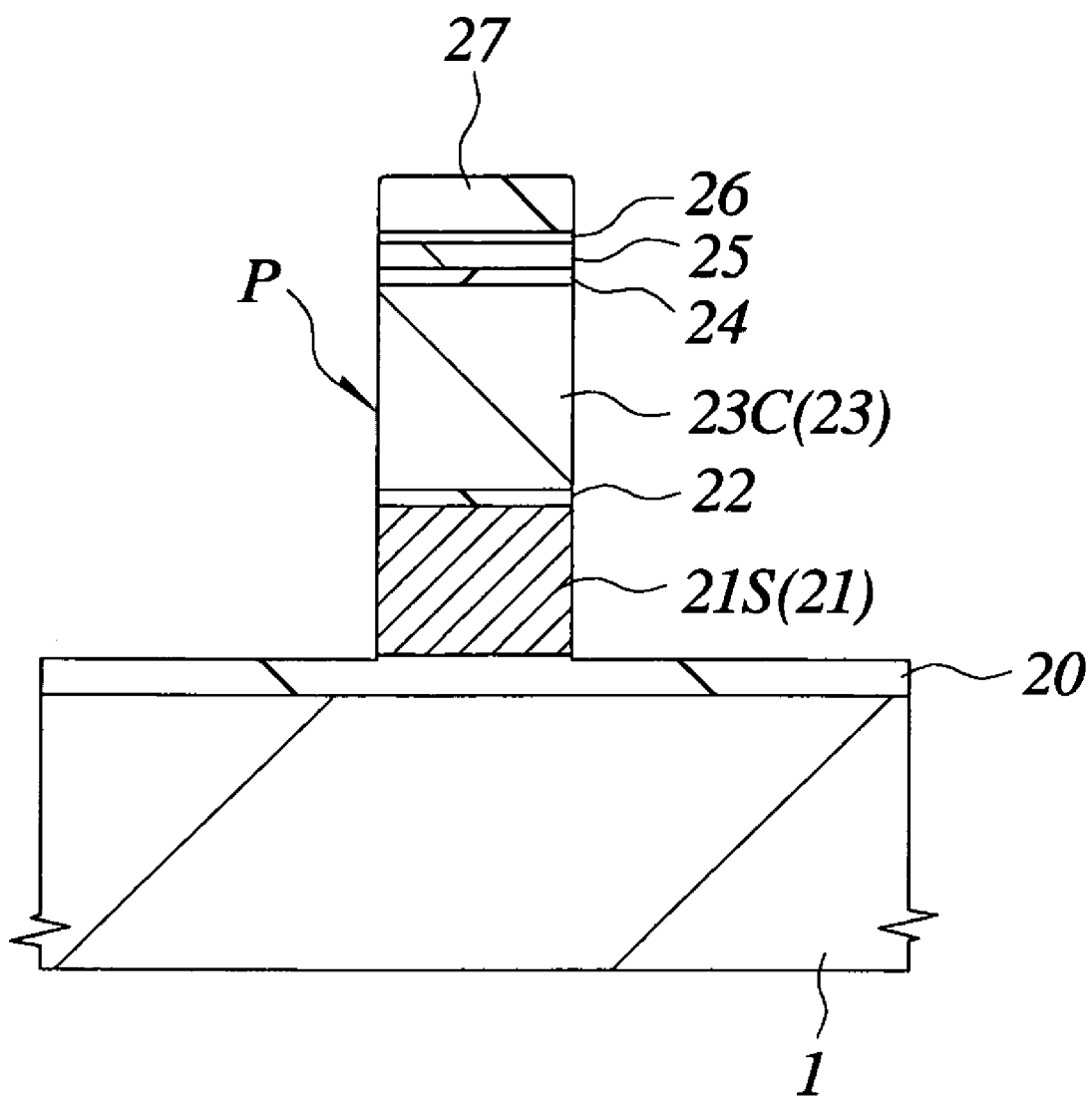
FIG. 30 is a sectional view showing a principal part of a semiconductor substrate in the MISFET manufacturing method according to another embodiment of the present invention.

Next, after removing the photoresist film 43 by the ashing, as shown in FIG. 30, the silicon oxide film 26, the poly-crystalline silicon film 25, the silicon nitride film. 24, the poly-crystalline silicon film 23, the silicon nitride film 22, and the poly-crystalline silicon film 21 are patterned by the dry etching with using the quadratic-prism patterned silicon nitride film 27 as a mask.

By the above-mentioned dry etching, a quadratic-prism laminate structure P, in which the poly-crystalline silicon film 21, the silicon nitride film 22, the poly-crystalline silicon film 23, the silicon nitride film 24, the poly-crystalline silicon film 25, and the silicon oxide film 26 are laminated in this order, is formed on the silicon oxide film 20. Additionally, by forming this laminated structure P, there are formed a source region 21S composed of the poly-crystalline silicon film 21 and a channel forming region 23C composed of the poly-crystalline silicon film 23 (and poly-crystalline silicon film 25) laminated thereon.

Figure 31:
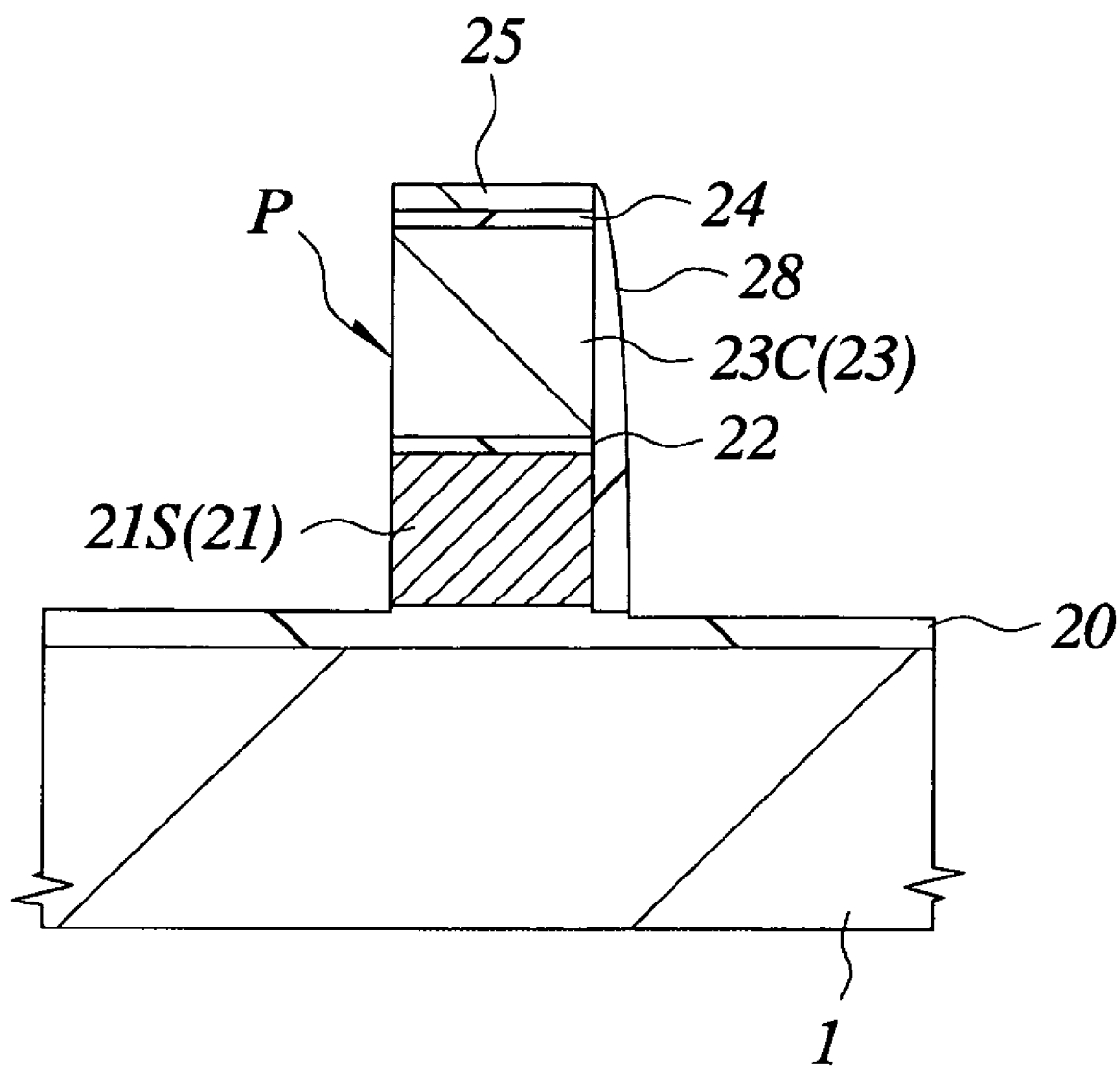
FIG. 31 is a sectional view showing a principal part of a semiconductor substrate in the MISFET manufacturing method according to another embodiment of the present invention.

Next, as shown in FIG. 31, after a sidewall spacer 28 composed of a silicon oxide film is formed on the sidewall of the laminated structure P, the silicon nitride film 27 and the silicon oxide film 26 at the top of the laminated structure P are removed by the etching. By so doing, the surface of the undoped poly-crystalline silicon film 25 is exposed. The sidewall spacer 28 is formed by depositing a silicon oxide film over the substrate 1 by the CVD method and then anisotropically etching the silicon oxide film. This sidewall spacer 28 is formed only on a part of the sidewall of the laminated structure P so that it cannot be formed on the other sidewalls.

Figure 32:
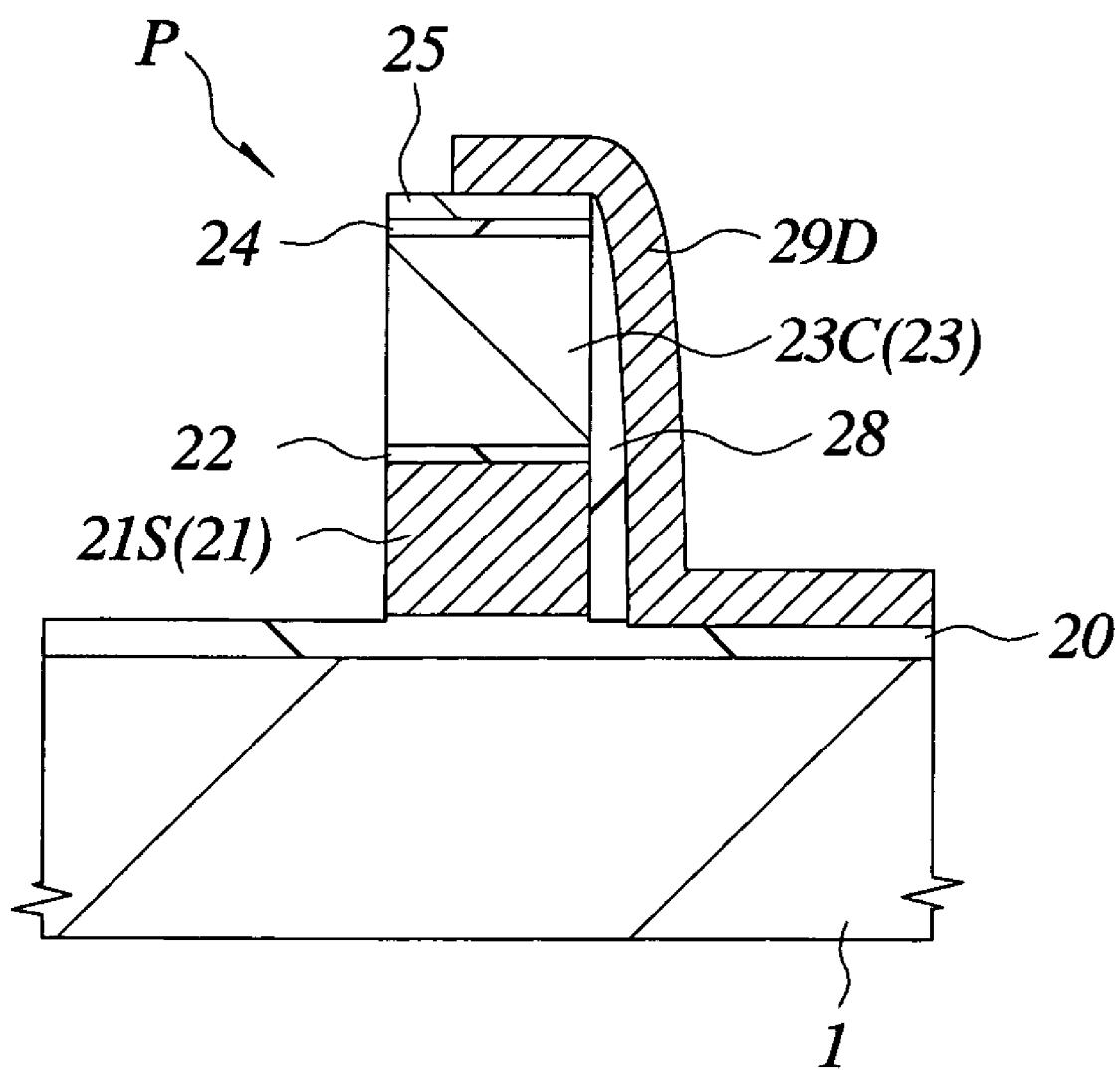
FIG. 32 is a sectional view showing a principal part of a semiconductor substrate in the MISFET manufacturing method according to another embodiment of the present invention.

Next, as shown in FIG. 32, a drain region 29D having one end extending to the top of the channel forming region (poly-crystalline silicon film 25) is formed. The drain region 29 is formed by: depositing, on the substrate 1 by the CVD method, a p type poly-crystalline silicon film (upper semiconductor layer) doped with boron; and thereafter patterning this poly-crystalline silicon film by the dry etching with using a photoresist (not shown) as a mask.

Next, the thermal treatment of the substrate 1 at a high temperature of approximately 900° C. to 1000° C. is performed to improve the film quality of the drain region 29D composed of the above-mentioned poly-crystalline silicon film. There is the problem that, when the above-mentioned thermal treatment is performed, a part of boron contained in the p type poly-crystalline silicon film constituting the drain region 29D is thermally diffused into the poly-crystalline silicon film 25 and the channel forming region 23C and the impurity concentration therein is increased. Additionally, there is also the problem that a part of boron contained in the source region 21S formed below the channel forming region 23C is thermally diffused into the channel forming region 23C.

Figure 33:
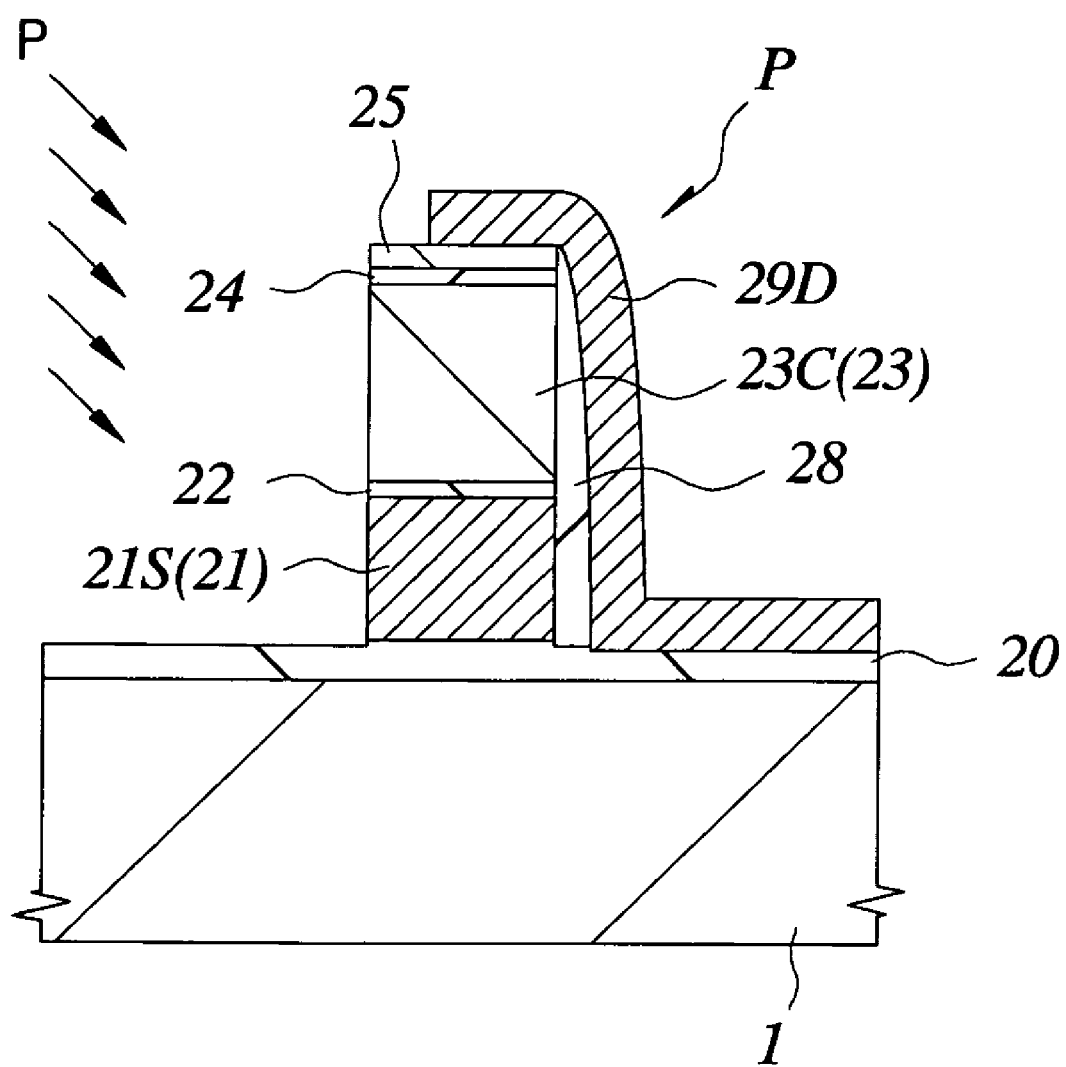
FIG. 33 is a sectional view showing a principal part of a semiconductor substrate in the MISFET manufacturing method according to another embodiment of the present invention.

For this reason, an n type impurity (phosphorus, arsenic, or antimony), which is of a conductivity type opposite to that boron, is introduced into the channel forming region 23C (poly-crystalline silicon films 23 and 25), as shown in FIG. 33. Since the top and a part of the sidewall of the laminated structure P are covered with the drain region 29D, the n type impurity is implanted from an oblique direction of 0° to 90° with respect to the main surface of the substrate 1. In this ion implantation from the oblique direction, for example, the semiconductor substrate 1 may be rotated every 90° with respect to the axis vertical to the main surface of the semiconductor substrate 1. Additionally, the dose amount of the n type impurity in this ion implantation is controlled so that the concentration of the n type impurity introduced into the channel forming region (poly-crystalline silicon films 23 and 25) 23C can be equal to or slightly higher than that of boron diffused from the drain region 29D into the channel forming region 23C. Note that, if such ion implantation is performed, phosphorus is introduced also into the drain region 29D composed of the p type poly-crystalline silicon film, so that it is desirable that the concentration of the boron in the drain region 29D is set high in view of this.

Thus, in this embodiment, since the boron diffused, into the channel forming region 23C, from the drain region 29D and the source region 21S each composed of a p type poly-crystalline silicon film, and the n type impurity (phosphorus, arsenic, or antimony) which is of an opposite conductivity type are counter-doped, it is possible to reduce the effective impurity concentration in the channel forming region 23C.

Figure 34:
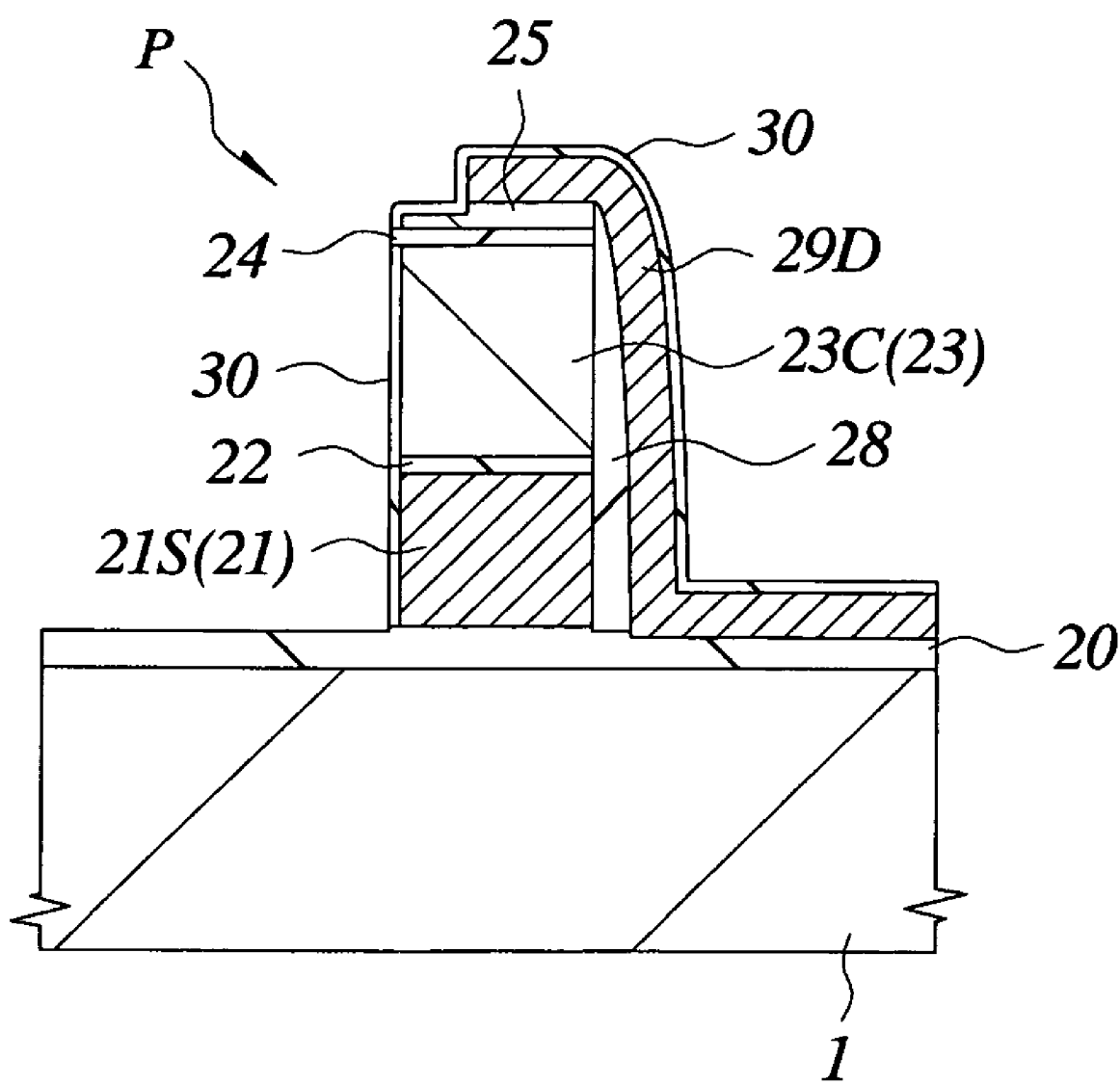
FIG. 34 is a sectional view showing a principal part of a semiconductor substrate in the MISFET manufacturing method according to another embodiment of the present invention.

Next, as shown in FIG. 34, a silicon oxide film 30 with a thickness of approximately 10 nm is formed on the surface of the channel forming region 23C (poly-crystalline silicon films 23 and 25) by the thermal treatment of the substrate 1 in the oxidizing atmosphere. At this time, the silicon oxide film 30 is formed also on the surface of the drain region 29D composed of a p type poly-crystalline silicon film. The silicon oxide film 30 formed on the surface of the channel forming region (poly-crystalline silicon films 23 and 25) functions as a gate insulating film.

Figure 35:
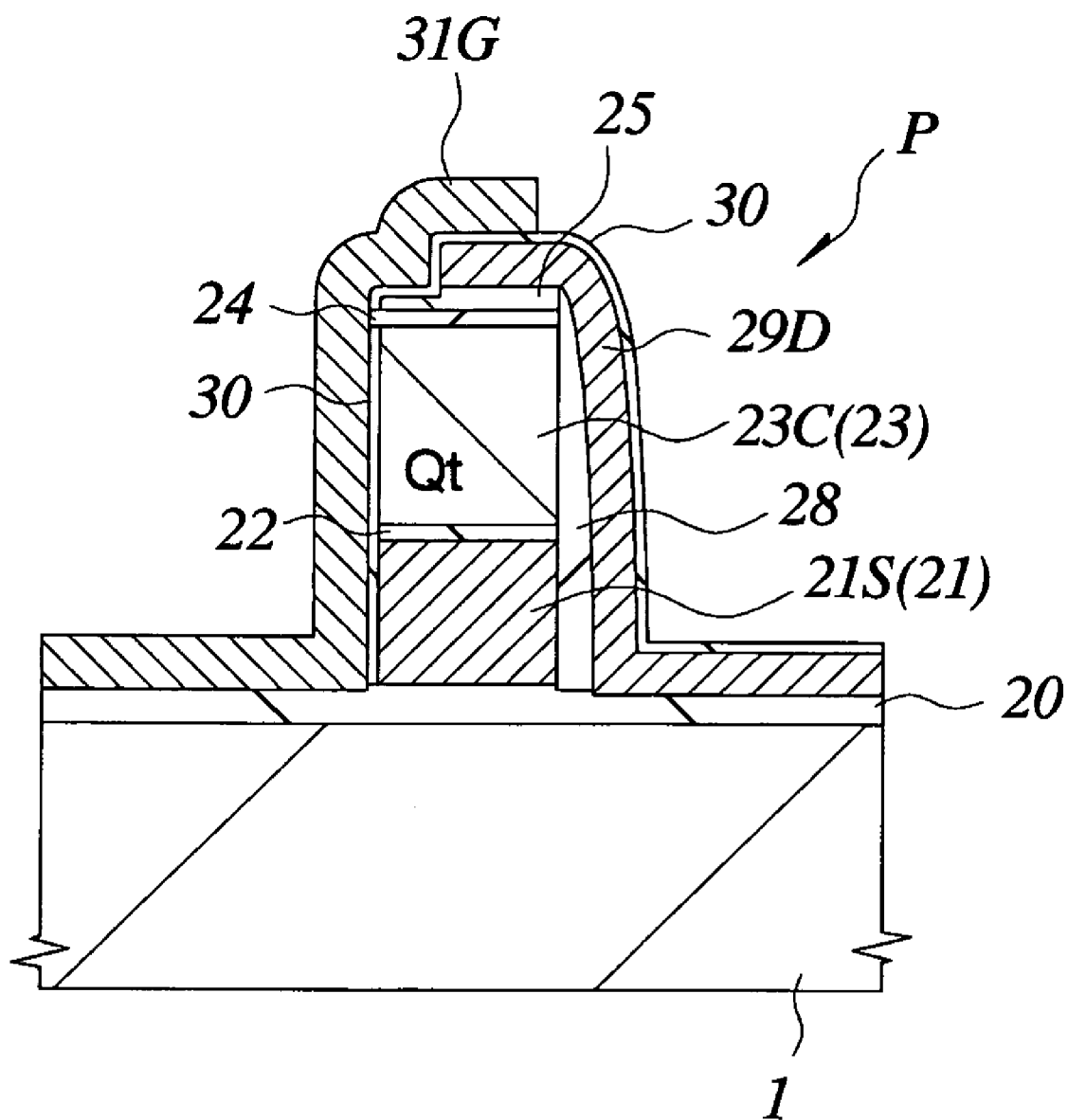
FIG. 35 is a sectional view showing a principal part of a semiconductor substrate in the MISFET manufacturing method according to another embodiment of the present invention.
Figure 36:
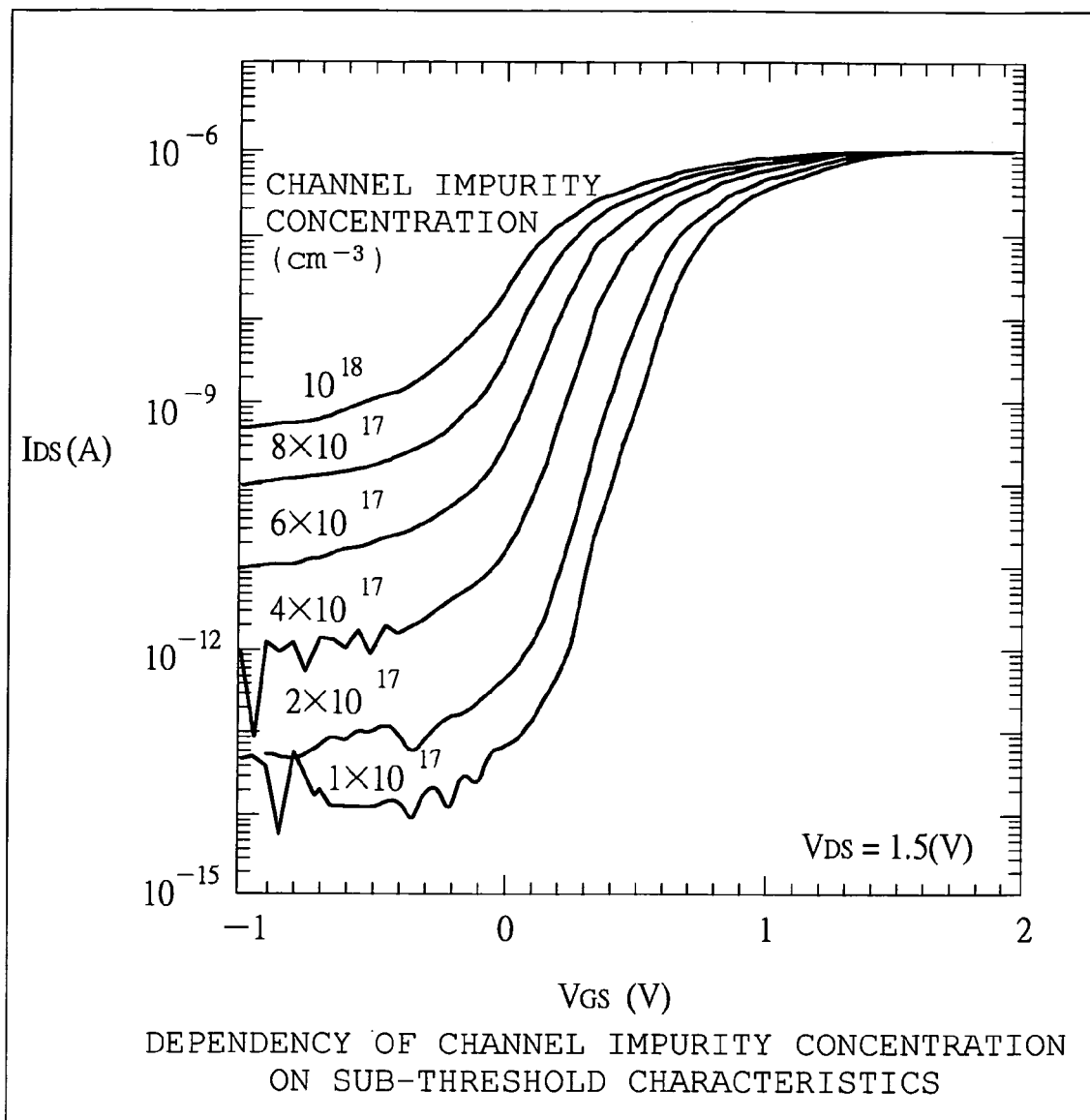
FIG. 36 is a graph showing dependency of sub-threshold characteristics on a channel impurity concentration.

Next, as shown in FIG. 35, a gate electrode 31G is formed so as to cover the silicon oxide film 30 formed on the surface of the channel forming region 23C (poly-crystalline silicon films 23 and 25). The gate electrode 31G is formed by: depositing, on the substrate 1 by the CVD method, a p type poly-crystalline silicon film doped with boron or an n type poly-crystalline silicon film doped with phosphorus; and thereafter pattering this poly-crystalline silicon film by the dry etching with using a photoresist film (not shown) as a mask.

Through the process as described so far, there is completed the MISFET Qt composed of the source region 21S, the channel forming region 23C (poly-crystalline silicon films 23 and 25), the drain region 29D, the silicon oxide film 30 (gate insulating film), and the gate electrode 31G.

As described above, according to this embodiment, since it is possible to reduce the effective impurity concentration in the channel forming region 23C of the MISFET Qt, the channel forming region 23C can be completely depleted when the MISFET Qt is not operated. Therefore, it is possible to manufacture the MISFET in which the off current (leakage current) is less. Additionally, since it is possible to control the variation of the threshold voltage of the MISFET Qt, the operation reliability of the MISFET can be improved.

(Third Embodiment)

The case where the n channel vertical MISFET is applied to the memory cell of the DRAM provided with a capacitor has been described in the first embodiment by way of an example. However, the present invention is not limited to the n channel vertical MISFET and the memory cell structure provided with the capacitor. More specifically, the present invention can be applied to the single vertical MISFET.

Figure 37:
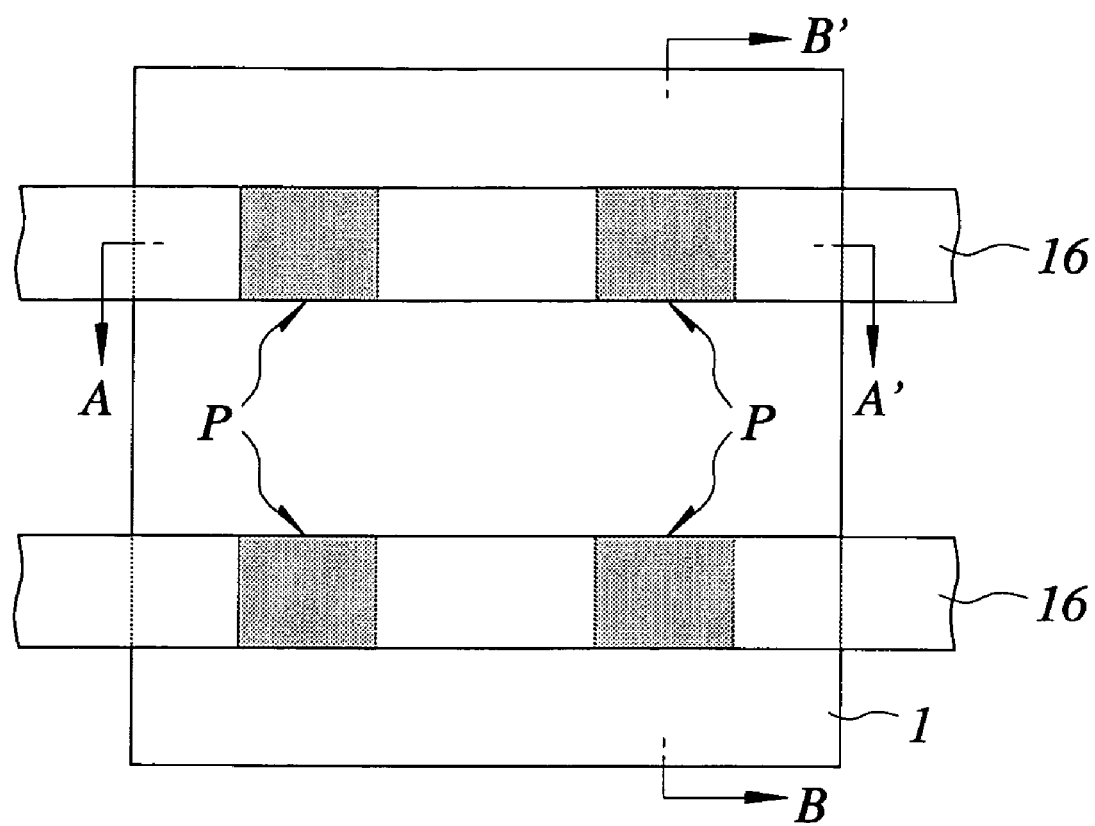
FIG. 37 is a sectional view showing a principal part of a semiconductor substrate in the MISFET manufacturing method according to still another embodiment of the present invention.
Figure 38:
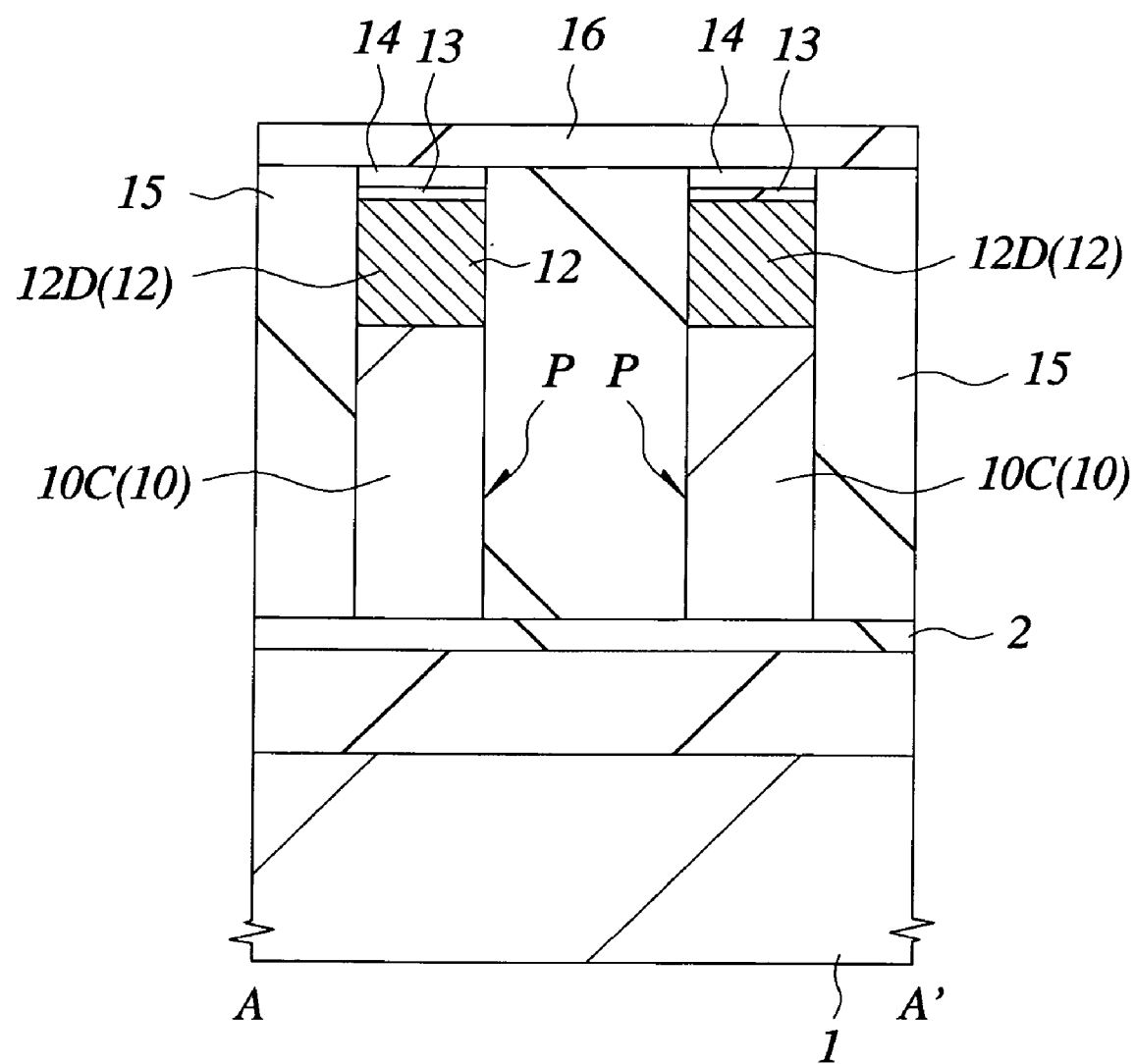
FIG. 38 is a sectional view taken along the line A–A' in FIG. 37.
Figure 39:
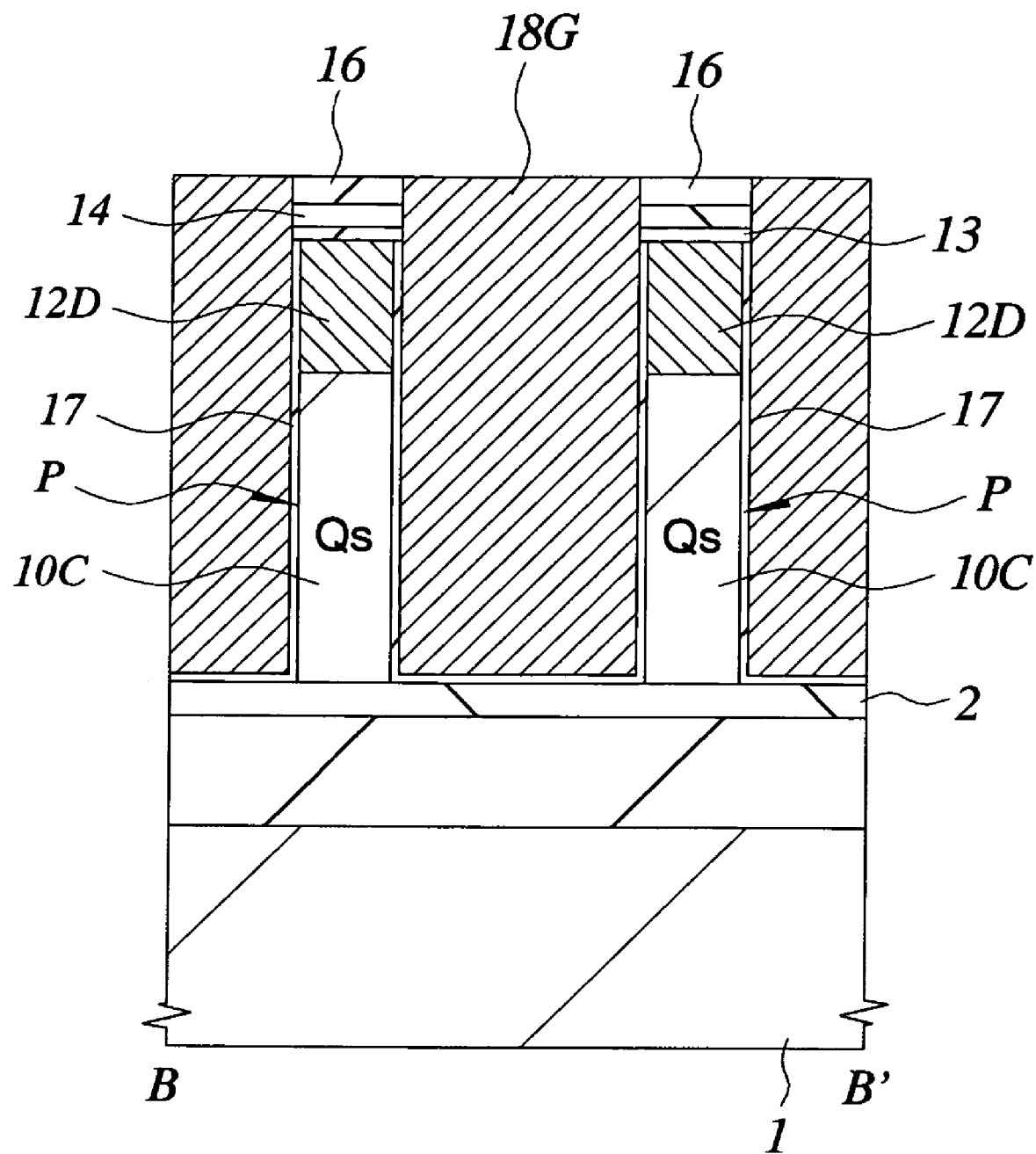
FIG. 39 is a sectional view taken along the line B–B' in FIG. 37.

FIG. 37 (plan view showing a region equivalent to four memory cells), FIG. 38 (sectional view taken along line A–A' in FIG. 37), and FIG. 39 (sectional view taken along line B–B' in FIG. 37) show an example of: forming an insulating film (silicon oxide film) on a semiconductor substrate 1; and forming a vertical MISFET thereon. Note that since the manufacturing method of this vertical MISFET is identical to that in the first embodiment except the step of forming the capacitor, the detailed description thereof will be omitted. However, the content to be its outline is described as follows. Also, the structure shown in FIGS. 37 to 39 can be applied to both of the n channel vertical MISFET and the p channel vertical MISFET.

The source and drain of the n channel vertical MISFET are composed of polycrystalline silicon films each doped with phosphorus and formed by the CVD method. Since phosphorus from the source and drain is diffused in the poly-crystalline silicon film of the channel forming region, boron (or $BF_2$) which is of a conductivity type opposite to that of phosphorus is introduced into the poly-crystalline silicon film of the channel forming region by the ion implantation method. This ion implantation is performed in the same manner as that described in the first embodiment. It is possible to reduce the effective impurity concentration in the channel by this ion implantation. Furthermore, the gate insulating film is formed by the thermal oxidation and the gate electrode is formed by the CVD method. By doing so, the n channel vertical MISFET is almost completed.

The source and drain of the p channel vertical MISFET is composed of a poly-crystalline silicon film doped with boron and formed by the CVD method. Since boron from the source and drain is diffused into the poly-crystalline silicon film of the channel forming region, phosphorus (arsenic or antimony) which is of a conductivity type opposite to that of boron is introduced by the ion implantation. This ion implantation can be achieved, by changing an ion seed from boron (or $BF_2$) to an n type impurity (phosphorus, arsenic, or antimony) in the same manner as that of the ion implantation into the poly-crystalline silicon film of the channel forming region described in the first embodiment. It is possible to reduce the effective impurity concentration in the channel by this ion implantation. Furthermore, the gate insulating film is formed by the thermal oxidation and the gate electrode is formed by the CVD method. By doing so, the p channel vertical MISFET is almost completed.

As described above, according to this embodiment, since it is possible to reduce the effective impurity concentration in the channel forming region 23 of the MISFET Qt, the channel forming region 23C can be completely depleted when the MISFET Qt is not operated. Therefore, it is possible to manufacture the MISFET in which the off current (leakage current) is less. Additionally, since it is possible to control the variation of the threshold voltage of the MISFET Qt, the operation reliability of the MISFET can be improved.

In the foregoing, the invention made by the inventors has been concretely described based on the embodiments. However, needless to say, the present invention is not limited to the foregoing embodiments, and can be variously modified and altered without departing from the gist thereof.

The case where the present invention is applied to the manufacturing method of a DRAM has been described in the first embodiment. However, the present invention is not limited to this, and can be applied to various manufacturing methods of semiconductor memory devices each using, as a memory cell, the vertical MISFET disclosed in the present invention.

INDUSTRIAL APPLICABILITY

Since it is possible to reduce the effective impurity concentration in the channel forming region of the MISFET, the channel forming region can be completely depleted when the MISFET is not operated. Therefore, it is possible to manufacture the memory cell in which the off current (leakage current) is less.

Also, since it is possible to reduce the variation of the threshold voltage of the MISFET, the MISFET with improved operation reliability can be manufactured.

The invention claimed is:
1. A vertical MISFET comprising:
a lower semiconductor layer of a first conductivity type formed over a main surface of a semiconductor substrate;
an intermediate semiconductor layer formed over said lower semiconductor layer, an impurity of a conductivity type opposite to said first conductivity type having been introduced into the intermediate semiconductor layer; and
an upper semiconductor layer of the first conductivity type, the upper semiconductor layer being formed over said intermediate semiconductor layer,
wherein at least said upper semiconductor layer and said intermediate semiconductor layer each have a columnar laminated structure,
said lower semiconductor layer constitutes one of a source and drain of said vertical MISFET, said upper semiconductor layer constitutes the other of the source and drain of said vertical MISFET, a gate electrode of said vertical MISFET is formed on a sidewall of said intermediate semiconductor layer via a gate insulating film, and
a concentration of said impurity introduced into said intermediate semiconductor layer is lower in regions of said intermediate semiconductor layer closer to said lower and upper semiconductor layers and is higher in a region of said intermediate semiconductor layer further from said lower and upper semiconductor layers.
2. The vertical MISFET according to claim 1,
wherein a concentration of said impurity introduced into said intermediate semiconductor layer is such that said intermediate semiconductor layer is completely depleted in the condition where a voltage is not applied to said gate electrode.

* * * * *